US009641923B2

(12) United States Patent
Hayes

(10) Patent No.: US 9,641,923 B2
(45) Date of Patent: May 2, 2017

(54) TRANSDUCER SYSTEM DRIVEN BY A SIGNAL TIME DELAY

(71) Applicant: Joseph Francis Hayes, Birkdale (AU)

(72) Inventor: Joseph Francis Hayes, Birkdale (AU)

(73) Assignee: ACOUSTIC 3D HOLDINGS LIMITED, Brisbane, Queensland (AU)

( * ) Notice: Subject to any disclaimer, the term of this patent is extended or adjusted under 35 U.S.C. 154(b) by 96 days.

(21) Appl. No.: 14/807,025

(22) Filed: Jul. 23, 2015

(65) Prior Publication Data

US 2016/0029108 A1 Jan. 28, 2016

Related U.S. Application Data

(62) Division of application No. 13/880,113, filed as application No. PCT/AU2011/001327 on Oct. 20, 2011, now Pat. No. 9,124,968.

(30) Foreign Application Priority Data

Oct. 21, 2010 (AU) ................................ 2010904695

(51) Int. Cl.
*H03F 99/00* (2009.01)
*H04R 1/02* (2006.01)
*G10K 11/20* (2006.01)

(52) U.S. Cl.
CPC ............... *H04R 1/02* (2013.01); *G10K 11/20* (2013.01)

(58) Field of Classification Search
CPC .................... H04R 2201/401; H04R 2201/403
USPC .......................................................... 381/120
See application file for complete search history.

(56) References Cited

U.S. PATENT DOCUMENTS

| | | | |
|---|---|---|---|
| 3,599,747 | A | 8/1971 | Hansen et al. |
| 4,031,318 | A | 6/1977 | Pitre |
| 4,800,983 | A | 1/1989 | Geren |

(Continued)

FOREIGN PATENT DOCUMENTS

| | | | |
|---|---|---|---|
| GB | 841440 A | 7/1960 |
| WO | WO-2007109828 A1 | 10/2007 |

OTHER PUBLICATIONS

Acoustic Reflections, 2004, Acoustics.com.
International Search Report to PCT/AU2011/001327 mailed Mar. 14, 2012.

*Primary Examiner* — Paul S Kim
*Assistant Examiner* — Katherine Faley
(74) *Attorney, Agent, or Firm* — Polsinelli PC

(57) ABSTRACT

A reflector and an electronic system produce a diffuse way by creating time delays in accordance with a number sequence. An acoustical passive reflector incorporates a series of wells in its surface to transform an acoustical wave into a series of acoustical waves having a time difference based on a number sequence. The electronic signal conversion system converts a signal into a series of signals having a time difference based on a number sequence. This can be used in an audio speaker system having N×N array of speakers where N is an odd prime number, arranged to be driven by the electronic signal conversion system in which the signal is converted into a series of signals centered on the signal with at least one signal being timed to precede the signal and at least one signal to follow the signal and the signal being arranged to be sent to the central speaker in the N×N array.

4 Claims, 18 Drawing Sheets

(56) References Cited

U.S. PATENT DOCUMENTS

| | | | | |
|---|---|---|---|---|
| 5,764,782 | A * | 6/1998 | Hayes .................... | B62D 35/00 181/155 |
| 2002/0094103 | A1 | 7/2002 | Babb et al. | |

* cited by examiner

Z = 24

TRANSDUCER SYSTEM DRIVEN BY A SIGNAL TIME DELAY

CROSS REFERENCE TO RELATED APPLICATIONS

This application is a Division of application Ser. No. 13/880,113 filed on Apr. 18, 2013, which is as a national stage application, under 35 U.S.C. §371, to PCT/AU2011/001327, filed Oct. 20, 2011, which claims priority to Australian Application No. 2010904695, filed Oct. 21, 2010. Each disclosure of the aforementioned priority applications is incorporated herein by reference in its entirety.

TECHNICAL FIELD OF THE INVENTION

The present invention relates to an acoustical arrangement, and in particular, to an acoustical arrangement that provides a means of generating diffuse waves within a fluid space. In particular this invention is directed to loud speaker arrangements adapted to generate diffuse waves.

BACKGROUND OF THE INVENTION

Loudspeakers have been the subject of many patents directed at improving the listening experience.

GB patent 841440 discloses a loudspeaker arrangement in which the speakers are arrayed in a trapezoid cabinet.

U.S. Pat. No. 4,031,318 discloses a semi omni-directional loudspeaker array covering the full audio range. Optional reflector surfaces are included.

U.S. Pat. No. 4,800,983 attempted to broaden the optimal listening angle by providing a diffractor labyrinth positioned obliquely in front of a speaker. This arrangement causes reflected energy to radiate off the sound producing transducers and cause interference to the resultant sound field.

U.S. Pat. No. 5,764,782 by the present inventor disclosed an acoustic reflector facing the sound source. The reflector had an odd prime number of wells having depths that varied according to a quadratic residue sequence.

It is an object of this invention to improve the reflector and the sound generation method of U.S. Pat. No. 5,764,782.

SUMMARY OF THE INVENTION

This invention is predicated on an understanding of the physiology of hearing and that the generation of diffuse waves would improve the listening experience.

A diffuse wave is a signal analysis function characterised by a time-amplitude shape that is likened to a small wave. Diffuse waves can be used to achieve many signal analysis results. When a diffuse wave is used to analyse data it will find the edges or points of change in the data. The scale of the diffuse wave can be changed so that it effects a different preference in spectrum content and other properties. The same data can be analysed with a different scale diffuse wave and the same edges or changes in the data will be discovered. Thus, by using a family of scaled diffuse waves a data set can be analysed and changes will show up on the results of all scales. The changes can be correlated against the results of different scales and data with high confidence of interpretation can be obtained.

A property of a diffuse wave can be that it has an auto-correlation result equal to zero. This means that there is no resemblance of any part of the diffuse wave response that is similar to any other part of the diffuse wave response. It changes over time in such a way to have no time-based pattern. If energy can be transmitted or caused to take on a zero auto-correlation diffuse wave shape then it will have a fiat spectrum. If it had any auto-correlation it would have a frequency dependent spectrum.

This invention is partly predicated on the discovery that a zero-auto correlation number sequence function when used correctly produces a diffusion wave function that can be used to control the spatial transmission of energy. When used in loudspeakers the spatial transmission under this method can exhibit omni-directional spatial patterns. A signal that has zero auto-correlation, that transmits in an omni-directional pattern can be described as being perfectly diffused energy. Such a signal is unique, as it has no phase. Therefore the energy is phase coherent in the spatial domain.

It is possible to use these diffuse wave based functions in a spatial transmission of energy either at one scale or at an infinite number of scales between a minimum and maximum scale envelope. They can be used as a diffuse carrier of intelligible information whereby the intensity of the transmission is controlled by a signal to modulate the power contained within the spatial environment. The spatial environment will contain the steady state transmitted signal component in equilibrium due to the diffusion process. The changes contained within that signal will be readily apparent on every scale of the diffuse wave functions that are radiated into the spatial environment. If these changes carry time based information then every spatial path of energy in the spatial environment will carry the same readily apparent time-change information of the source signal. This diffuse time-change information will recreate a three dimensional spatial images of the source signal that enhances the brains interpretation of the signal.

The present invention provides an acoustical arrangement which in one embodiment is a reflector of the type disclosed in U.S. Pat. No. 5,764,782 which can be used for reflecting waves from a sound generating source. The reflector comprises a surface facing the source. The surface has a plurality (N) of wells, where N is an odd prime number, running along a length direction of the surface. Each well has a depth $D_n=(n^2 \text{ rem } N)*\text{unit depth}$ $(0<=n<=N-1)$, governed by a Quadratic Residue Sequence (QRS). Correct use of the QRS will produce a diffuse wave response with zero auto-correlation. Thus, acoustic energy directed from the source to the reflector, and reflected from the reflector takes on a diffuse wave response. It has substantially equal acoustic energy in all angular directions from the reflector and the energy in any direction is diffuse and encoded with a diffuse wave transform which enables the creation of a three dimensional spatial images from one reflector or between reflectors. The depth of each well is corrected by the variance between a spherical wave from the source and the distance from the surface of the reflector to the source.

The depth of each well is also corrected by the variance between a spherical wave from the source, the angle at which the source is incident to the reflecting surface, and the effective modified distance from the incident surface of the reflector to the source.

The depth of each well may also be corrected by the variance between a spherical wave from the source, the angle at which the source is incident to the reflecting surface, and the distortion of angle due to localised impedance changes in the fluid of the spatial environment around the interface to each individual well surface of the reflector to the source.

Each of the wells have depths $D_n=(n^2 \text{ rem } N)$*unit depth, governed by a Quadratic Residue Sequence, and a radiating source is positioned or coupled at an extremity of each of the wells.

In another aspect this invention provides a loudspeaker system having a speaker and a tweeter in which an acoustic driver of correct spectral response placed in time alignment with the acoustic center of a tweeter and wired out of phase wherein the tweeter has associated with it a reflector having wells arrayed in a quadratic residue sequence such that the energy from the acoustic driver is used to phase cancel the direct radiated energy of the tweeter. Preferably this system has a woofer and a tweeter positioned in time alignment wherein the tweeter acts as the source driver for a reflector having wells arrayed in a quadratic residue sequence. Preferably the speaker used in this arrangement is fitted in a cabinet in which the panels of the cabinet incorporate lines of weakness or increased strength in the cabinet panels wherein the lines of weakness or strength are spaced in a random prime number ratio and produces nodular points of anti-resonanace.

In another aspect this invention provides a means of generating a diffuse wave without the use of a reflector.

In this aspect the invention provides a transducer system comprising:

a surface having a plurality (N or $N^2$), (where N is an odd prime number) of transducers arranged in an N×1 or N×N matrix; and each transducer driven by a amplifier and signal time delay means, each signal time delay means governed by the relationship $$T_{i,j}=[(i^2+j^2)\text{rem } N]\text{*unit delay.}$$

This invention also provides an acoustical passive reflector which incorporates a series of wells in its surface to transform an acoustical wave into a series of acoustical waves having a time difference based on a number sequence.

In an electronic version this invention provides an electronic signal conversion system which converts a signal into a series of signals having a time difference based on a number sequence.

Preferably the number sequence used in the reflector or the electronic system is selected from a Quadratic Residue Sequence, a Barker code, a zero auto-correlation sequence or a complementary sequence.

In another embodiment the present invention provides an audio speaker system having N×N array of speakers where N is an odd prime number, arranged to be driven by the electronic signal conversion system in which the signal is converted into a series signals centred on the signal with at least one signal being timed to precede the signal and at least one signal to follow the signal and the signal being arranged to be sent to the central speaker in the N×N array. The position of the signal can be moved within the array.

BRIEF DESCRIPTION OF THE DRAWINGS

FIG. 15 A shows fluting on the internal edges of the end wells while

DETAILED DESCRIPTION OF THE INVENTION

Figure 1:
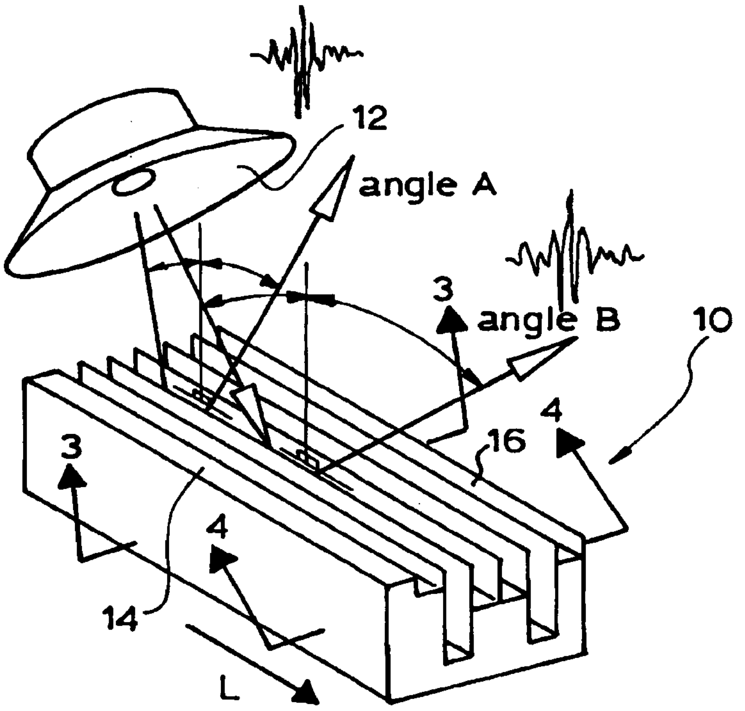
FIG. 1 is a perspective view of an acoustic source in relation to a reflector.

FIG. 1 shows a reflector 10. In a preferred embodiment in accordance with the present invention, acoustic energy from a source 12, such as a loud speaker, is directed to the reflector 10 and is reflected a length direction L from a series of wells 16 formed in a planar surface 14 of the reflector 10 into a listening environment. Each of the wells 16 runs along, and is parallel to, the length L. A Quadratic Residue Sequence governs the depth of each well 16. The reflected acoustic energy has substantially equal acoustic energy in all angular directions from the reflector 10 within plus or minus ½Pi(90°) angular direction from the direction of radiation.

Figure 2:
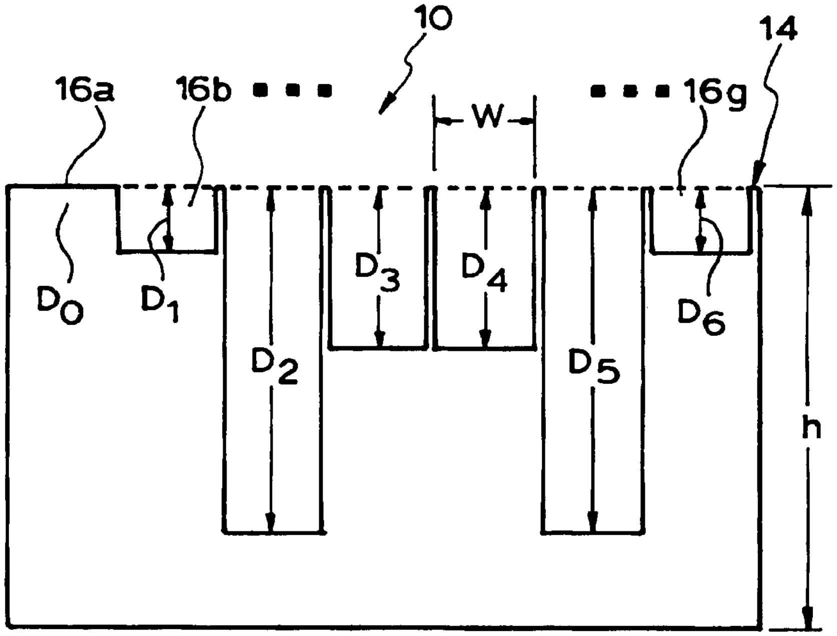
FIG. 2 is a cross-sectional view taken along section 3-3 of FIG. 1 of a reflector in accordance with the present invention having wells in the surface, the depths of the wells governed by a Quadratic Residue Sequence.

Referring to FIG. 2, a cross-sectional view of the reflector 10 is shown along the 20 line 3-3 shown in FIG. 1. The reflector 10 has N wells 16 of varying depths $D_0$, $D_1$, . . . $D_{N-1}$ in the planar surface 14. The reflector 10 shown in FIG. 2 has seven such wells 16*a*-16*g* in the planar surface 14. The depths of the wells 16 are determined by applying a mathematical number sequence to predetermine the phase relationship between adjacent elements of radiated acoustical energy. That is, the varying depths of the wells 16 adjust the elements to correct for the phase differences.

One such mathematical number sequence which can produce a diffuse wave response with auto-correlation equal to zero is known as a Quadratic Residue Sequence (QRS). The QRS is a number sequence with a total element length equal to any odd prime number N (e.g., 1, 3, 5, 7, 11, 13, 17, 19, 23, 29 . . . ); N is the number of wells 16 in the surface 14. The individual element solutions are governed by the relationship $S_n = n^2$rem N (i.e. the least non negative remainder resulting when subtracting multiple N from $n^2$)

Table 1 shows the solution to a QRS derived for a sequence having seven elements (i.e. N=7):

TABLE 1

| Element Number (O < n < (N − 1)) | Element No. Squared (n2) | Sn n2 rem N |
|---|---|---|
| 0 | 0 | O rem 7 = 0 |
| 1 | 1 | 1 rem 7 = 1 |
| 2 | 4 | 4 rem 7 = 4 |
| 3 | 9 | 9 rem 7 = 2 |
| 4 | 16 | 16 rem 7 = 2 |
| 5 | 25 | 25 rem 7 = 4 |
| 6 | 36 | 36 rem 7 = 1 |
| 7 | 49 | 49 rem 7 = 0 |
| 8 | 64 | 64 rem 7 = 1 |
| 9 | 81 | 81 rem 7 = 4 |
| 10 | 100 | 100 rem 7 = 2 |
| 11 | 121 | 121 rem 7 = 2 |
| 12 | 144 | 144 rem 7 = 4 |

TABLE 1-continued

| Element Number (O < n < (N − 1)) | Element No. Squared (n2) | Sn n2 rem N |
|---|---|---|
| 13 | 169 | 169 rem 7 = 1 |

It is the property of the QRS that any one period (N adjacent elements) of the sequence can be used to achieve the diffuse wave function. Thus, the sequence can start at any number n, or fraction thereof, so long as it resolves one complete cycle of the sequence, i.e. Nw in periodic width (where w is the width of a well). The following Table 2 starts at n=4 and includes n=10, i.e. N=7 elements.

TABLE 2

| Element Number (O < n < (N − 1)) | Element No. Squared ($n^2$) | $S_n$ $n^2$ rem N |
|---|---|---|
| 4 | 16 | 2 |
| 5 | 25 | 4 |
| 6 | 36 | 1 |
| 7 | 49 | 0 |
| 8 | 64 | 1 |
| 9 | 81 | 4 |
| 10 | 100 | 2 |

The following Table 3 starts at n=2 and includes n=6, i.e. N=5 elements. The solution 4, 1, 0, 1, 4 happens to also appear nested inside the solution of 2, 4, 1, 0, 1, 4, 2 of table 2. It is a property of the QRS that solution for lower prime umbers appear nested inside higher prime umber solutions.

TABLE 3

| Element Number (O < n < (N − 1)) | Element No. Squared ($n^2$) | $S_n$ $n^2$ rem N |
|---|---|---|
| 2 | 4 | 4 |
| 3 | 9 | 1 |
| 4 | 16 | 0 |
| 5 | 25 | 1 |
| 6 | 36 | 4 |

If a set of solutions $S_n$ for any N, do not suit an application, a constant can be added to each solution $S_n$, and then apply the formula: $S_n=(S_n+a)$ rem N, where a is a constant.

Thus for the natural solution for N=7 being 0,1,4,2,2,4,1 we can add, e.g. a=3 to each $S_n$ and transform the solution to 3,4,0,5,5,0,4.

The reflector 10 of FIG. 2 has a plurality of wells 16 whose depths are the solutions to the QRS multiplied by some unit depth. That is, the depth of well 0 (16*a*) is 0; the depth of well 1 (16*b*), immediately adjacent to well 0 (16*a*), is 1*unit depth; the depth of well 2 (16*c*), immediately adjacent to well 1 (16*b*), is 4*unit depth, etc. It is desired that the elements of acoustic energy radiated from the source 12, when they are reflected from the surface 14 having the wells 16, mix in a far field space to exhibit a diffuse and diffuse wave encoded sound field. The "perfect" solution to the QRS provides equal acoustic energy in all angular directions from the reflector 10 nominally within plus and minus PI/2 angular direction from the direction of radiation but in practice greater.

A preferred practical design of a focused reflector will provide the acoustic centre at a distance of 38 mm from the surface of the reflector. The well width is selected to be 8.15 mm. The overall reflector width is therefore 57.0 5 mm.

The classic QRD solution and the modified focused QRD solution for when the design frequency is selected to be 1800 hz is shown in Table 4;

TABLE 4

| Element | Solution to QRD | Depth | Radial Error | Modified Depth |
|---|---|---|---|---|
| 0 | 0 | 0 mm | 9.5 mm | 0 mm |
| 1 | 1 | 9.5 mm | 5.1 mm | 11.7 mm |
| 2 | 4 | 38.1 mm | 1.9 mm | 41.9 mm |
| 3 | 2 | 19.1 mm | 0.2 mm | 23.7 mm |
| 4 | 2 | 19.1 mm | 0.2 mm | 23.7 mm |
| 5 | 4 | 38.1 mm | 1.9 mm | 41.9 mm |
| 6 | 1 | 9.5 mm | 5.1 mm | 11.7 mm |

Other suitable number sequences are those used in signal processing such as a Barker code, a zero auto-correlation sequence or a complementary sequence.

A Barker code is a sequence of N values of +1 and −1, $a_j$ for j=1, 2, . . . , N such that $$\left|\sum_{j=1}^{N-v} a_j a_{j+v}\right| \leq 1$$

for all 1≤v<N.

Autocorrelation is the cross-correlation of a signal with itself. Informally, it is the similarity between observations as a function of the time separation between them. It is a mathematical tool for finding repeating patterns, such as the presence of a periodic signal which has been buried under noise, or identifying the missing fundamental frequency in a signal implied by its harmonic frequencies. It is often used in signal processing for analyzing functions or series of values, such as time domain signals.

Complementary sequences (CS) derive from applied mathematics and are pairs of sequences with the useful property that their out-of-phase aperiodic autocorrelation coefficients sum to zero. Binary complementary sequences were first introduced by Marcel J. E. Golay in 1949. In 1961-1962 Golay gave several methods for constructing sequences of length $2^N$ and gave examples of complementary sequences of lengths 10 and 26. In 1974 R. J. Turyn gave a method for constructing sequences of length mn from sequences of lengths m and n which allows the construction of sequences of any length of the form $2^N 10^K 26^M$.

Two main design variables, the unit depth and the element width govern the useful frequency bandwidth over which the reflector 10 is effective. The lowest useful frequency is controlled by the amount of path introduced by the various well depths. The highest useful frequency is controlled by the width of the wells.

To control the low frequency design frequency of the mechanical diffuse wave generator, the unit depth is set to equal 1/N times the design wavelength. For example, if the unit depth is 10 millimeters and N=7, then the design wavelength is given by:

$$X = N \times 10 \text{ millimeters} = 70 \text{ millimeter}$$

From this, the design frequency is calculated:

$$\begin{aligned} F &= c/\lambda_D \\ &= 343/(70\times 10^{-3}) \\ &= 4.9 \text{ kHz (or 3,46 kHz when the reflective angle of 45} \\ &\quad \text{degrees is considered as extra path length)} \end{aligned}$$

It has been observed that the reflector 10 works to $\lambda_D/2$. Below the design frequency the wells become dimensionally insignificant to the phase of the source frequency and the acoustical arrangement acts as a normal radiator or flat surface reflector. The highest frequency at which the reflector is effective, the cut-off frequency, is governed by the individual well width, w, or the relation to the design frequency. Using the previous example, if the well width is 10 millimeters then the cut-off frequency is given by;

$$\begin{aligned} \lambda &= w \times 2 \\ &= 20 \text{ millimeters} \end{aligned}$$

And thus the frequency is given by:

$$\begin{aligned} F &= c/\lambda_W \\ &= 343/(20\times 10^{-3}) \\ &= 17.15 \text{ kHz} \end{aligned}$$

Another factor that limits the high frequency effectiveness is that the sequence does not work at a frequency of (N−1) times the design frequency. That is, still using the numbers of the previous example, $$\lambda_{high} = \lambda_D/(N-1)$$

$$\lambda_D = 70 \text{ mm}$$

thus $$\begin{aligned} \lambda_{high} &= 70 \text{ mm}/6 \\ &= 12.67 \text{ mm} \end{aligned}$$

$$\begin{aligned} \text{thus}\quad f_{high} &= 343/\lambda_D \\ &= 343/12.67 \text{ mm} \\ &= 29.4 \text{ kHz (or 20.8 kHz when the reflection angle of} \\ &\quad \text{45 degrees is considered as extra path length)} \end{aligned}$$

In this example, cut-off frequency governed by 2×w is less the lesser of the two limiting frequencies and is thus the actual high frequency cut off point. Therefore, the lower of the two frequencies will be the cut-off frequency.

Figure 6:
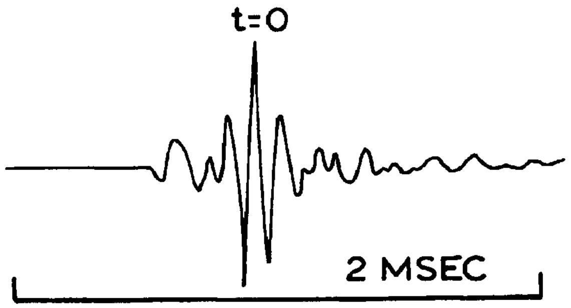
FIG. 6 is a time amplitude response of the diffuse wave function at one particular scale.

To ensure against error interference with the zero autocorrelation property of the diffuse wave function great care and correct compensations have to be incorporated into the design. At zero autocorrelation the output by itself will carry no meaningful information that can be interpreted by an observant receptor such as that of the human listening system. The resultant diffuse wave function, as shown in FIG. 6, is 'silent'. However, the tolerance to errors is very small whereby the percentage error from ideal should be less than 3% in amplitude or phase. The greater the error the more audible the diffuse wave function becomes. It is the intensity of the driving source signal we want to hear in the listening spatial environment, not the diffuse wave function. Because the QRS effects a wide range of frequencies nominally it is most important that the higher end of the useful spectrum of the design maintain a criteria of less than 3% error. As the frequency spectrum lowers, the component wavelength increases and the errors due to path travel will become relatively insignificant provided the source spatial origin remains stationary over the spectral domain. Some speaker drivers show a significant acceleration of the movement of the acoustic centre at very high frequencies. The acoustic centre will start to move rapidly towards the voice coil of the driver as say above 10 kHz. Thus a decision can be made to focus the reflector on the stable acoustic centre position at 10 kHz and below for the benefit of the more important messaging frequencies found lower in the spectrum.

A diffuse wave function, FIG. 6, can be used at a particular scale to find the 'edge' in a signal. In psychoacoustics the edge of the acoustic signal mark the spatial image contained within. Therefore diffuse waves can be used to define the spatial, or three dimensional acoustical image of an electro-acoustic signal.

The reflector 10 in accordance with the present invention assumed that the acoustic energy from the source 12 is in the form of a planar wave. However, acoustic drivers rarely produce planar waves. In fact, most acoustic drivers, particularly dome tweeters, produce spherical or quasi-spherical waves. Therefore, the wells 16 in the planar surface 14 of the reflector 10 are not of the perfect depths (within 3% error) to achieve a zero-auto-correlation (inaudible) acoustic energy radiated patterns from most acoustic drivers.

Figure 3:
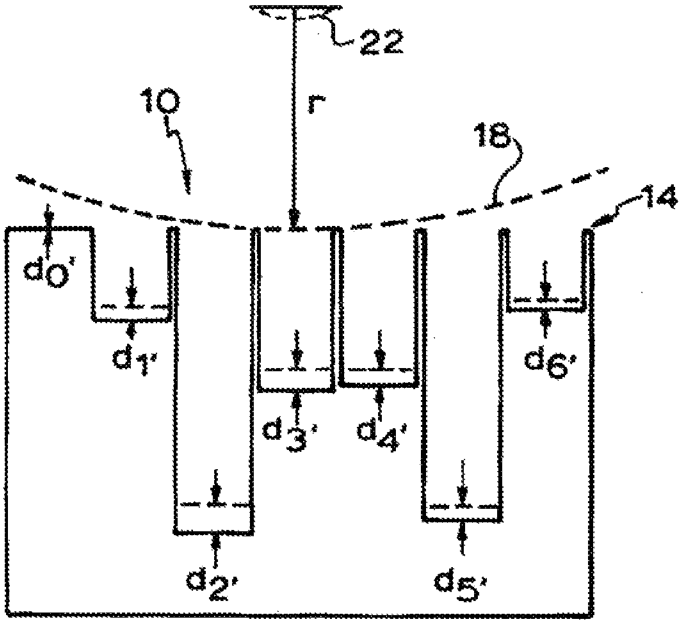
FIG. 3 is a cross-sectional view taken along 4-4 of FIG. 1, or one embodiment of an improved reflector in accordance with the present invention

FIG. 3 shows the virtual elongation of the reflector depth when a pathway that is non perpendicular to the surface of the reflector is considered. These elongated distances can be incorporated into the focusing of the reflector.

Figure 4:
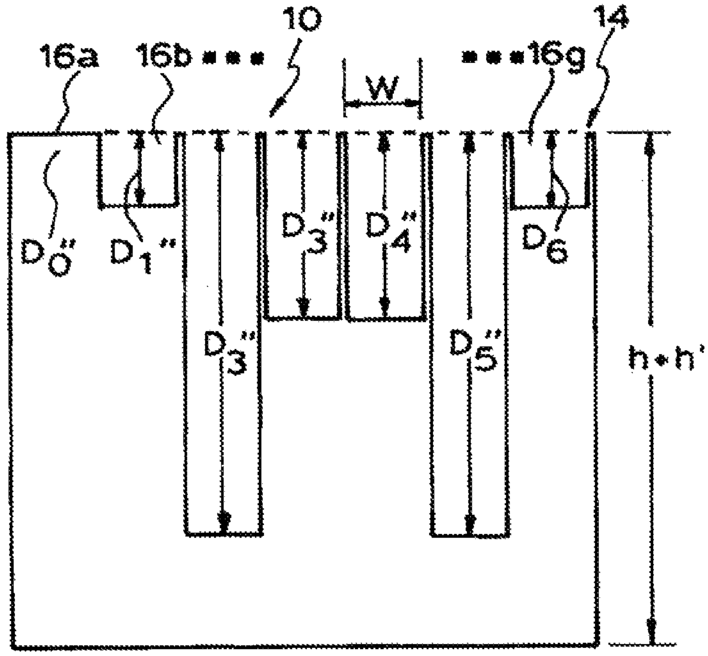
FIG. 4 is a cross-sectional view taken along section 3-3 of FIG. 1 of the same reflector in accordance with the present invention having a series of nested wells, with each nest governed by a Quadratic Residue Sequence showing the correction for a spherical wave front from the source.
Figure 5:
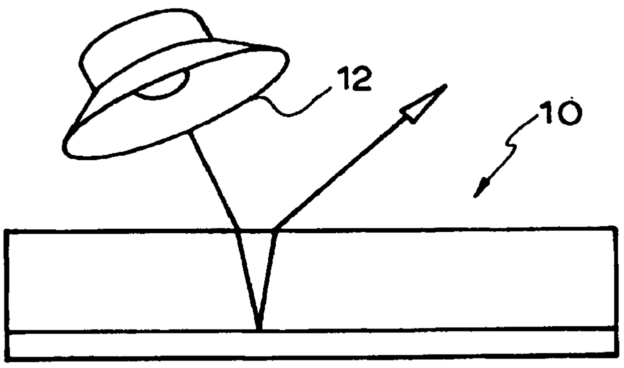
FIG. 5 is a latitudinal section view taken along the length direction L of FIG. 1, or one embodiment of an improved reflector in accordance with the present invention showing the correction for the distortion of angle due to localised impedance changes in the fluid of the spatial environment around the interface to each individual well surface of the reflector to the source.

FIG. 4 shows a further embodiment of an acoustic reflector in accordance with the present invention. Some of the distances shown in FIG. 4 have been exaggerated for clarity of explanation. The planar surface 14 (shown by a dot-dash line in FIG. 3) of the reflector 10 of FIG. 1 is shown along the section of the line 3-3. As with the reflector of FIG. 2, the planar surface 14 has N wells 16 varying depths $D_0$, $D_1$, . . . $D_{N-1}$. The depths $D_0$, $D_1$, . . . $D_{N-1}$ are shown by the dashed lines in FIG. 4. The depths of the wells 16 are governed by the solution to the Quadratic Residue Sequence for N=7.

However, the reflector 10 in accordance with the present invention corrects for the variance between the distance traveled by a spherical wave 18 from the source and the distance traveled by a planar wave. The solid lines in FIG. 4 show the corrected well depths.

It can be seen that the distance traveled by the radiating elements of the spherical wave 18, for any element other than the one associated with the center well 16*d*, is greater than the distance traveled by a planar wave front. For a perpendicular incident wave, the distance traveled by a particular element of a spherical wave is a combination of the distance from the source to the surface and the depth of the associated well. That is, where "r" denotes the radius from the source to the reflector and $d_n$ is the correction distance, the distance traveled by a spherical wave element is:

$dist_{spherical}(n)=r+d_n+2*D_n$, whereas the distance traveled by a planar wave is:

$dist_{planar}(n)=r+2*D_n$,

The extra distance $d_0$ is determined geometrically to be:

$d_n=sqrt[r^2+\{[n-(N/2)]*w\}^2]-r$, where w is the width of the wells.

As it cannot be assured that the wave front is purely spherical and that the 'acoustic center' of the source is stationary over a spatial and spectral domain a more reliable alternative is to use the distance from the source derived from a group delay measurement to indicate the arrival time of a reference wave front to the center of each well element on the diffusing surface 14. The arrival time to each element is measured. The timing difference between the arrival time to each element and the arrival time to a reference element, such as the center element, can be computed. These timing differences when related to the speed of sound can be changed to distance. This is advantageous when the actual distance from the source is not exactly the path taken by an ideal wave front.

It is within the scope of this invention to modify the sound source from a spherical wave to a linear wave front. This may be achieved by providing wherein a row of micro electro mechanical system (mems) transducer elements are aligned above a normal QRD that has not been focused to a point in space. For this to work the impinging wave front must be linear. Therefore the array of mems are used to form a linear wave front that cause a linear reflection onto the surface of the reflector.

Due to the factors governing the physical characteristics of the diffuser it is only the relative depths and shape of the wells that need be varied to correct for the difference between the spherical wave and the planar wave. In a planar well bottom solution the correction distance d'(n) for a particular well, relative to the n=0 well, is $$d'(n)=\frac{do-\left(sqrt\left[r^2+\{[n-(N/2)]^*w)^2\right]-r\right)}{2}$$

In the embodiment shown in FIG. 4, each of the wells has a depth D", plus the correction distance d". This will give rise to one particular scale of diffuse wave function as shown in FIG. 7.

FIG. 3 shows a similar situation to FIG. 2 but where the angle of incidence is at a less acute angle than that stated previously. The same formulae can be used but the correction distances will be different as the acute angle elongates the whole design to appear deeper than the original.

Figure 7:
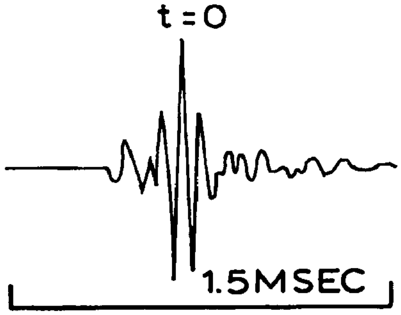
FIG. 7 is a time amplitude response of the diffuse wave function at another particular scale.

This angle of incidence will cause a longer scale of diffuse wave function, FIG. 7, than the first as shown in FIG. 6. Likewise there are an infinite number of solutions available between the smallest and largest acute angle of incidence. Therefore, there is an infinite number of possible scaled diffuse wave functions available between the highest scale set by the least acute incident wave front and the most acute incident wave front.

Figure 8:
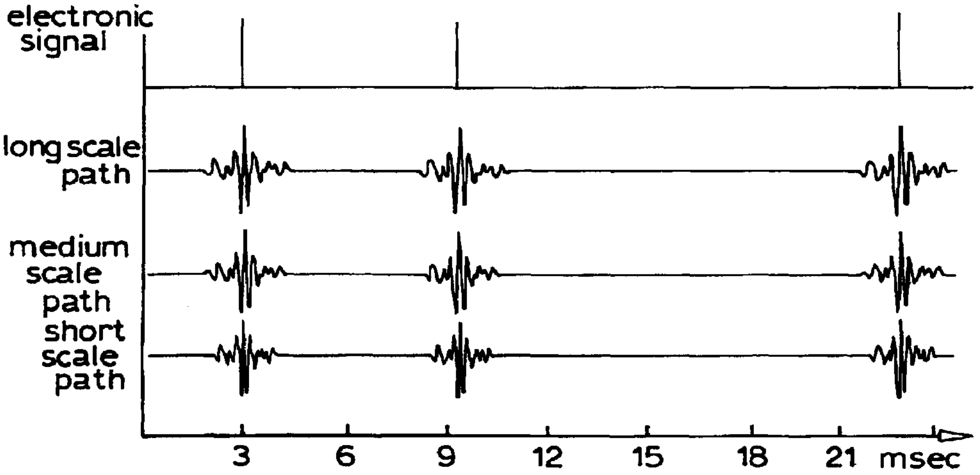
FIG. 8 is a series of time amplitude responses of first an electronic signal and the same signal which has been encoded with three different scale diffuse wave functions.

At a particular angle of incidence a singularly unique scale of diffuse wave function will encode the reflected energy and the acoustic energy will travel into the listening environment in a singularly unique path. As the angle of incidence of the source to the reflector changes there is an induced change of scale of the depths of the reflector and therefore a change of scale of the resultant diffuse wave function. This effect is integrated over the whole solid angle of the minimum angle of incidence to the maximum angle of incidence. In FIG. 8, the same time based changed signal-is shown with three different scales of diffuse wave encoding due to three sample discrete angles of incidence of the source to the reflector.

The encoded signal has a different scale diffuse wave on each paths shown in FIG. 8. These paths will be angular to each other and will form different trajectories within the listening environment. The effect on any single diffuse wave scale is to make the detection of the changes in source signal very easy to detect in amongst noise. Other path signals could be considered noise relevant to the path under consideration. All paths will eventually find their way to the listening position and each and every path and reflection will carry the same time based signal changes of the source signal. In this way the perception of the changes in the signal will be heightened by every impinging wave front upon the listener within the listening environment.

The timing information of the source will be so clear that the listener's perception system will attribute the spatial dimension back to the perceived image in the room. The perceived image is localised at a time=0 datum at the point of minimum distance between a stereo pair of loudspeakers. It can produce an image either from in front or behind the sources therefore the speakers can be listened to from behind whereby they act as a sound projector away from the listener.

When the listening position is at an acute axis to the centerline of the stereo speaker placement the image remains in the same source position as though the listener was placed immediately in front of the stereo pair. When the listener is position directly on top of the speaker the image still appears to be offset into a sound scape directly between the sources away from the listening position. The timing information is so apparent that the brain alludes that it is hearing the real source signal and the time-change information defining source spatial location. Therefore the diffuse wave function renders the sound as three dimensional defined by the source signal changes and not by any other environmental factor. The intra element phase jumps exhibit a random nature. Table 5 shows the solution for N=7 and the relative solution jump between consecutive elements. The 1st element in the period is considered against the last element in the period. When an element has a smaller solution than its predecessor the assumption is that it moves forwards through N to reach the smaller solution. Thus in gap between 4 and 1 adjacent solution is the equivalent gap between 4 and 8 and N has been added to the comparative solution. The relative jumps are all number sequence element numbers 0, 1, 2, 3, 4, 5, and 6. However their order is 1st through the even element jumps then through the odd element jumps. This renders the signal very difficult to create the conditions for feedback. The Laplace transform for a QRD is 1/N. This invention therefore reduces feedback by 1/N.

TABLE 5

| Element Number (O < n < (N − 1)) | Element No. Squared ($n^2$) | $S_n$ $n^2$ rem N | Relative solution jump between $S_n$ and $S_{n-1}$ |
|---|---|---|---|
| 4 | 16 | 2 | 0 |
| 5 | 25 | 4 | 2 |
| 6 | 36 | 1 | 4 |
| 7 | 49 | 0 | 6 |
| 8 | 64 | 1 | 1 |
| 9 | 81 | 4 | 3 |
| 10 | 100 | 2 | 5 |

The use of zero autocorrelation in the system to reenergize an acoustical space has a benefit in the live reproduction of audio systems. In prior art an open microphone (one that has its gain left open) is prone to feedback. Feedback is the condition whereby the sound reproduction system supplies and room acoustic combination yield enough energy to cause the open microphone to sustain a frequency that in turn grows in amplitude until a howling sensation takes over. This is basic instability in the sound reproduction system. To compensate prior art typically place the sound reproduction system (PA) between the band and the audience.

The zero autocorrelation sound reproduction system described in this patent stabilize the feedback path to the open microphone by breaking down the acoustical condition required to sustain feedback. Therefore it reintroduces stability into open microphone sound reproduction systems.

The benefit in sound reproduction is that the skill of the operator can be less as the thresholds of problematic feedback are removed. This allow the amplification of natural acoustical instrument to occur without having to use non-natural transduction system such as piezo electric crystals. It also mean the sound reinforcement system no longer needs to be situated in front of the band but before the audience to create an acoustic feedback path with sufficient immunity to ensure the manageability of feedback situation prevailing. Thus the sound reinforcement system may now be behind the band who is engaged directly with and nearer to the audience.

Therefore the technology can be used in public address systems or other acoustic spaces that are easier to treat with the techniques disclosed in this invention than to modify the building or use other construction solutions.

The feedback stability of the zero autocorrelation system can be used to improve the prior art of having to hold a telephone headset or mobile phone to the users temple. This classic approach used is to place the ear close to the sound reproduction source so that the sound created is not enough to feedback into the open microphone on the handset near the users mouth. Algorithms are used to simplex the conversation in that when the user is speaking the signal transduced by the microphone is intentionally not reproduced through the users ear speaker. Thus the feedback path is broken. These algorithm depend on their ability to predict which user is currently holding the conversation. By using a zero autocorrelation speaker in the ear piece of a handset or a mobile phone the user would be able to move the headset or mobile phone away from the ear and turn up the volume of the ear piece as the zero autocorrelation speaker would input the stability required for this apparatus to work in such an altered acoustic method. It may no longer require the use of simplex signal control.

The wells may be non-linear below the reflector surface providing control over the distribution of scale of the reflected diffuse wave functions. It should be noted that with the reflectors shown in FIG. 1-4, the reflectors will still provide a broad angle of maximum reflected energy.

Figure 9:
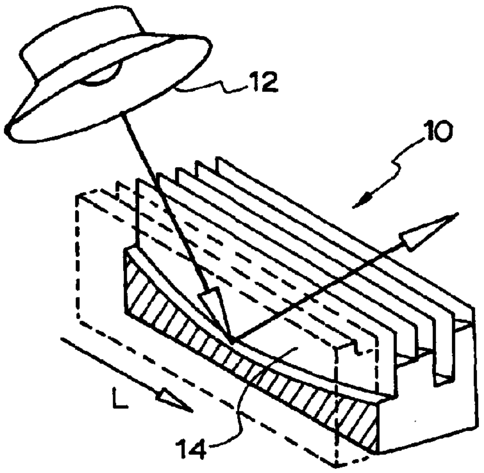
FIG. 9 is a perspective cutaway view of the embodiment of FIG. 1, where the well bottoms are concave.
Figure 10:
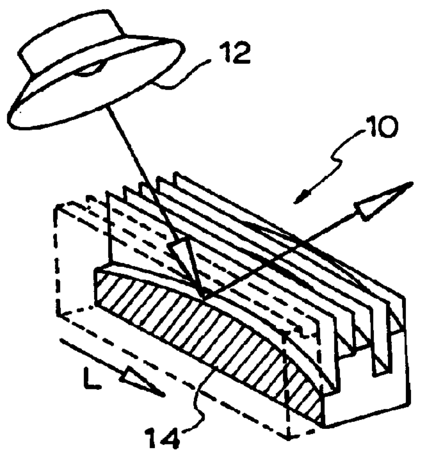
FIG. 10 is a perspective cutaway view of the embodiment of FIG. 1, where the well bottoms are convex.

Furthermore, as described in U.S. Pat. No. 5,764,782 the bottom of each well may be concave or convex. These are illustrated in FIGS. 9 and 10.

It is preferred that the speaker driver 12 be at 45 degrees with respect to the length direction L of the wells in the diffusing surface 14, and in the plane of the depths of the wells. When the direction of acoustic radiation from the speaker driver 12 is at such an angle with respect to the diffusing surface and the wells, driver interference with the resultant diffuse far field pressure wave is minimised, and the path difference between the particular segments to the far field is maximised.

Furthermore, since it is the object of the reflector embodiment to reflect sound from a speaker driver onto the reflector surface, and reflect a resultant sound field into a listening environment, it is particularly important that minimal stray paths exist for radiation directly from the speaker driver into the listening environment.

It is therefore preferable to use speaker drivers that concentrate their near-field energy directly onto the reflector surface by using dimensionally larger radiating surfaces with the speakers. That is, a speaker driver with a very wide sound radiation pattern may actually radiate sound directly to the listener without first reflecting off the reflector. This will cause frequency dependent phase cancellation and also upset the group delay alignment in this band of frequencies.

Figure 11A:
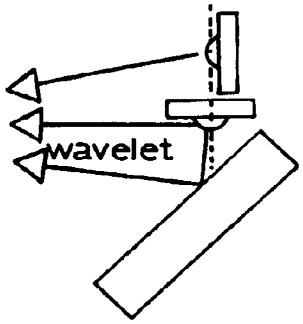
FIG. 11A is a side view of an arrangement of drivers depicted whereby the use of a surrogate driver is utilised to phase cancel direct spectral radiation into the listening environment from the source driver.

Invariably there will be some amount of direct energy radiated from the tweeter into the spatial environment. This invention provides a way to cancel out this energy so that only the diffuse wave energy is dominant on the spatial environment. FIG. 11A shows an embodiment whereby a suffragette loudspeaker 64 of correct spectral response is placed in time alignment with the acoustic center of the tweeter 60 and wired out of phase. The energy from this suffragette driver 64 is used to phase cancel the direct radiated energy of the reflector source driver leaving only the diffuse wave encoded acoustic wave.

Figure 11B:
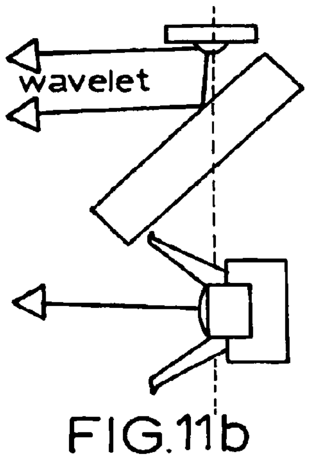
FIG. 11 B is a side view of an arrangement of drivers depicted whereby extension of the allowable radiation of the woofer is increased to allow it to phase cancel direct spectral radiation into the listening environment from the source driver.

As most loudspeaker designs include a woofer and a tweeter it is possible to use crossover techniques to eliminate spurious direct radiation from the source of the diffuse wave function driver. FIG. 11 B shows a preferred embodiment whereby the woofer 65 and source tweeter 60 are positioned in acoustic centre alignment. The tweeter 60 acts as the source driver for an acoustical diffuse wave generator reflector 10. The spectrum of the direct energy from the source tweeter is limited in spectrum due to the directivity of the tweeter source. Therefore the energy of the woofer is allowed to increase past the crossover frequency to such an extent to phase cancel the direct energy of the source tweeter. The result of the combination of these two wave front will be the spectrum of the woofer alone below the crossover frequency. The reflected diffuse wave function energy will fill the rest of the spectrum above the lower crossover frequency, FIG. 13—$f_{cl}$. The woofer is crossed over at the upper limit of the crossover band, FIG. 13 $f_{ch}$, and the tweeter is crossed over at the lower limit of the band, FIG. 13—$f_{cl}$.

Preferably Fcl=2,500 Hz. Fch=5,500 Hz.

Figure 13:
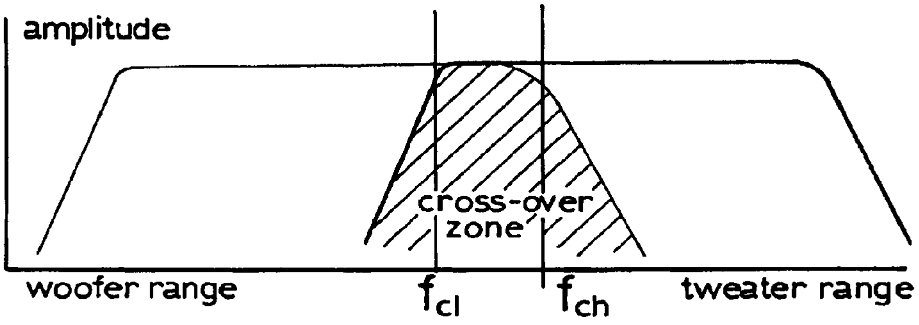
FIG. 13 is a bode plot representation of the arrangement of FIGS. 11B and 12B whereby a crossover band is used to achieve control over direct spectral radiation into the listening environment from the source driver

The preferred embodiment name is the cross-over band. The shape of the band is the shape of the direct energy spectrum from the source tweeter as shown in FIG. 13.

Figure 12A:
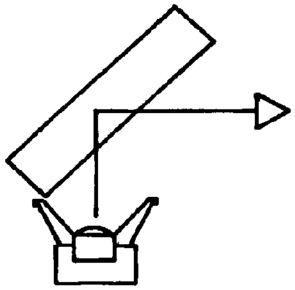
FIG. 12A is a side view of an arrangement of a full range driver and a reflector are used to cover the whole spectrum.
Figure 12B:
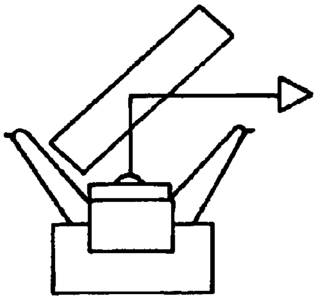
FIG. 12B is a side view of an arrangement of concentric drivers and a reflector are used to cover the whole spectrum.

These crossover issues can be resolved by placing the reflector on top of a broad-band source driver 67, FIG. 12A or a concentric driver arrangement where the tweeter 60 is positioned concentrically inside a woofer 65, FIG. 12B. In this way both drivers work into the reflector and undergo the same reflection of wave paths. The length of the reflector component in FIG. 12*a* is important as it can smooth out the transition between non reflective and reflected diffuse energy. The apex of a passive reflector may incorporate soft radius to minimise diffraction from this surface.

A further embodiment of the present invention is to improve the acoustic performance of the speaker drivers by using support cabinets that eliminate unwanted resonance. This can be achieved by incorporating lines of weakness or increased strength in the panels that are spaced in a random prime number ratio sequence to produce anti-resonance nodes of vibration at the lines of strength or weakness. Preferably cuts are made in the cabinet panels in a random prime number ratio sequence.

Figure 22:
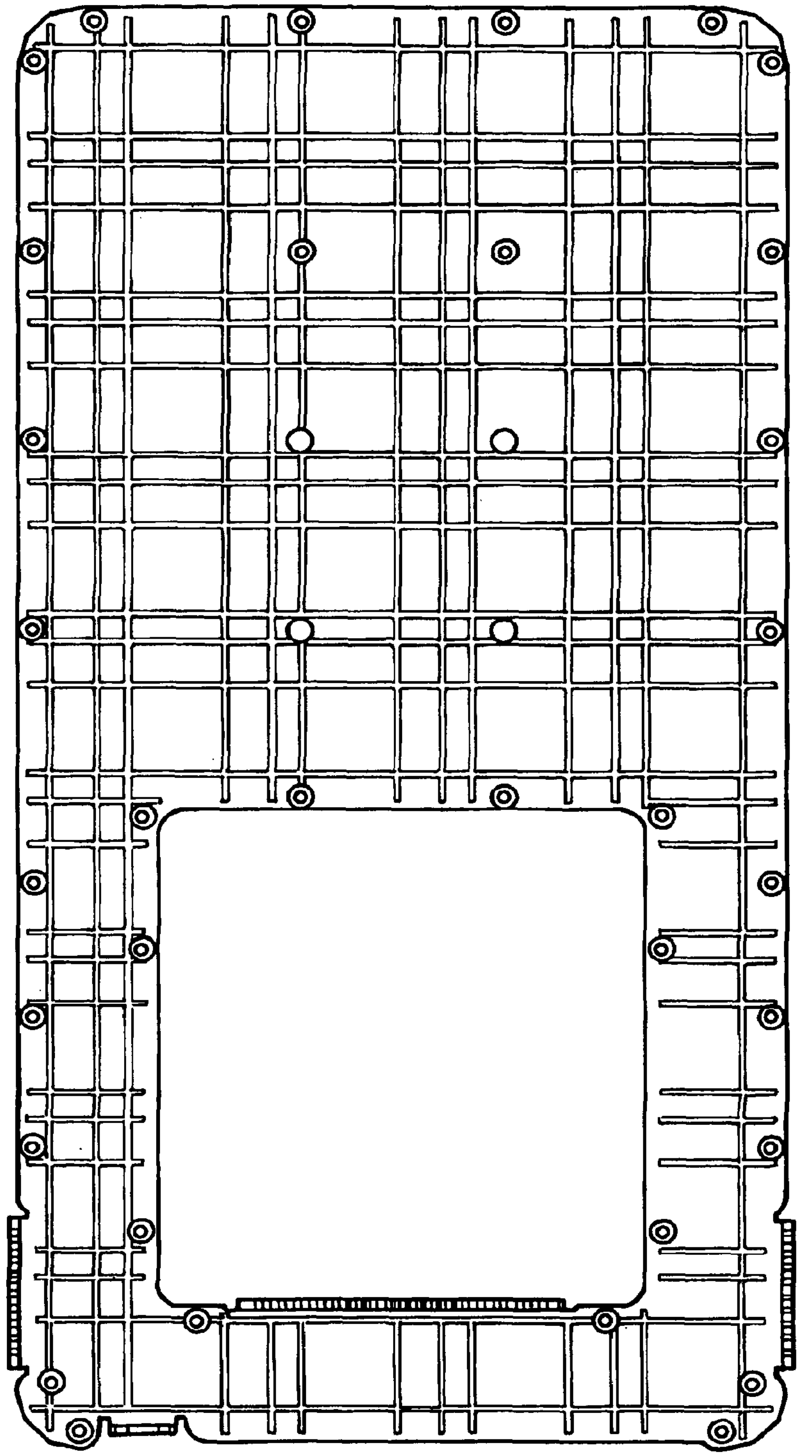
FIG. 22 illustrates another embodiment of the invention in which the potential sympathetic resonating panels incorporate lines of weakness.

FIG. 22 illustrates a rear panel of a speaker cabinet incorporating cuts into the panel surface to provide lines of weakness. The cuts are spaced using a random odd prime number sequence such as 3,5,7.

Figure 23:
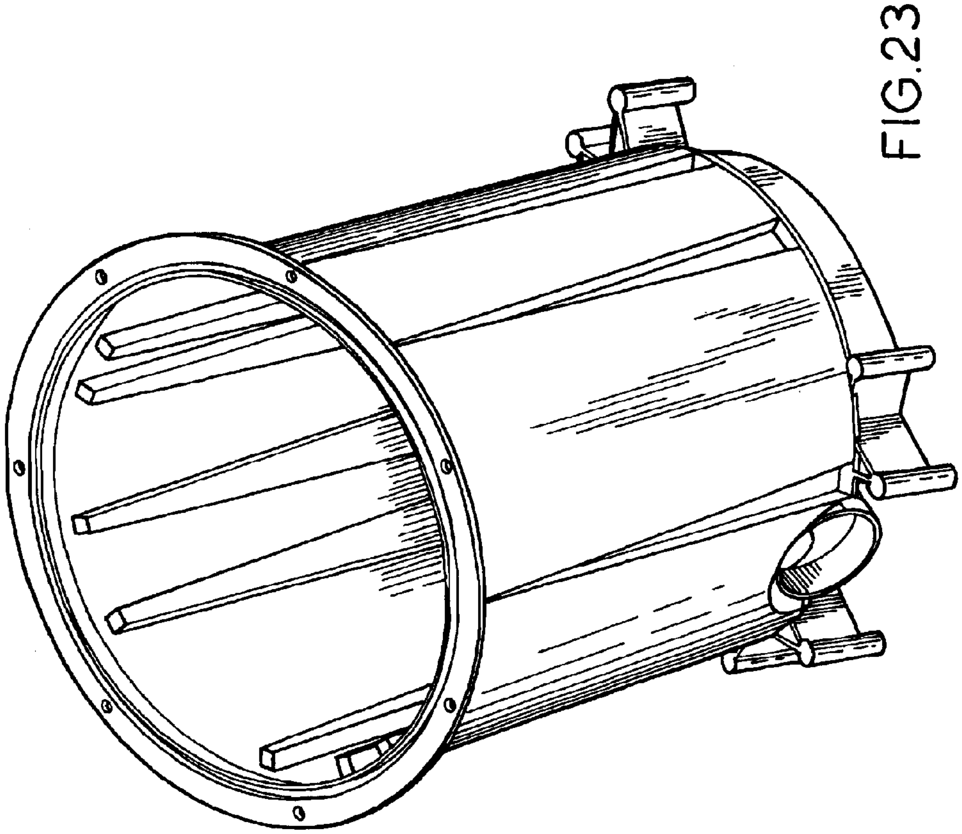
FIG. 23 illustrates another embodiment in which a potential sympathetic resonating cylinder incorporates strengthening elements.

FIG. 23 illustrates a tapered cylinder for a speaker driver incorporating a series of tapered reinforcing ribs moulded into the side wall at spacings of 11,3,7,3,5,3,7,3,5,7,3.

TABLE 6

| Randon Prime Sequence Element Value | Computation | Sector Solution for a circular construction |
|---|---|---|
| 11 | = 11/57 × 360 degrees | 69.5 degrees |
| 3 | = 3/57 × 360 degrees | 18.9 degrees |
| 7 | = 7/57 × 360 degrees | 44.2 degrees |
| 3 | = 3/57 × 360 degrees | 18.9 degrees |
| 5 | = 5/57 × 360 degrees | 31.7 degrees |
| 3 | = 3/57 × 360 degrees | 18.9 degrees |
| 7 | = 7/57 × 360 degrees | 44.2 degrees |
| 3 | = 3/57 × 360 degrees | 18.9 degrees |
| 5 | = 5/57 × 360 degrees | 31.7 degrees |
| 7 | = 7/57 × 360 degrees | 44.2 degrees |
| 3 | = 3/57 × 360 degrees | 18.9 degrees |
| Total = 57 | Total = 360 degrees | |

Figure 26:
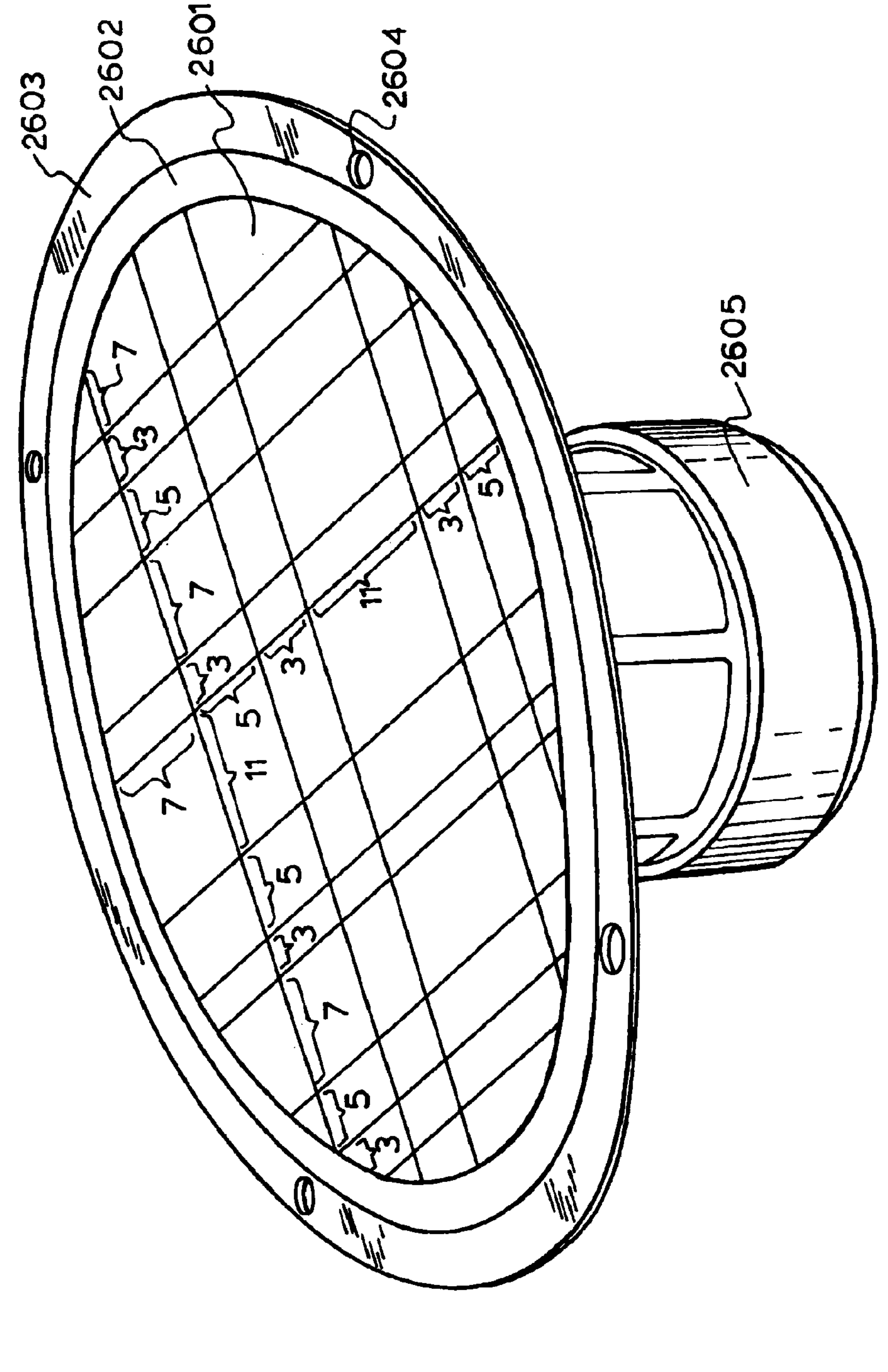
FIG. 26 and FIG. 27 show embodiments of loudspeaker drivers that incorporate lines of strength or weakness.
Figure 27:
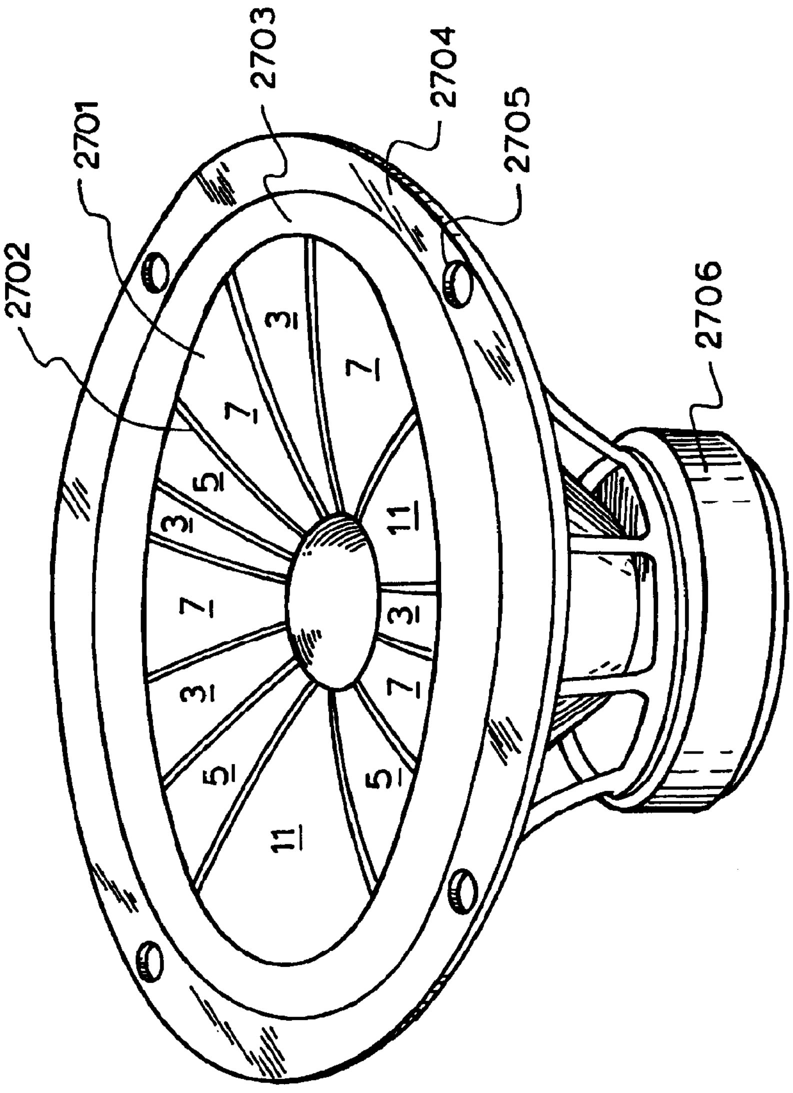

FIG. 26 shows a speaker cone wherein the cone has lines of added strength arranged in a random prime number sequence. FIG. 27 shows a speaker cone wherein the cone has lines of added strength arranged radially by sectors governed by a random prime number sequence.

FIG. 26 and FIG. 27 show embodiments of loudspeaker drivers that incorporate lines of strength or weakness governed by a random prime number sequence as set out in table 4. FIG. 26 shows a two dimensional pattern of lines of strength places on a speaker cone 2601. The cone is held into position by a roll surround 2602 that in turn is fixed to a spider support 2603. The spider support has four mounting holes 2604 that allow the driver to be fixed into position. The cone is driven by a motor mechanism 2605.

These embodiments are useful wherever anti resonance measures are needed such as speakers in vehicle doors or the vehicle door panels.

FIG. 27 shows radial lines of strength 2702 on a speaker cone 2701. The speaker cone is held in position by a roll surround 2703 that in turn is fixed to a spider structure 2704. The spider structure 2704 has four mounting holes 3705 that allow the driver to be fixed in position. The cone 2701 is driver by a motor mechanism 2706 held in position by the spider mechanism 2704.

For passive reflector embodiments a baffle behind the speaker driver may cause more energy to be reflected onto the reflective surface therefore ensuring a better overall sound output from the reflector device.

Figure 21:
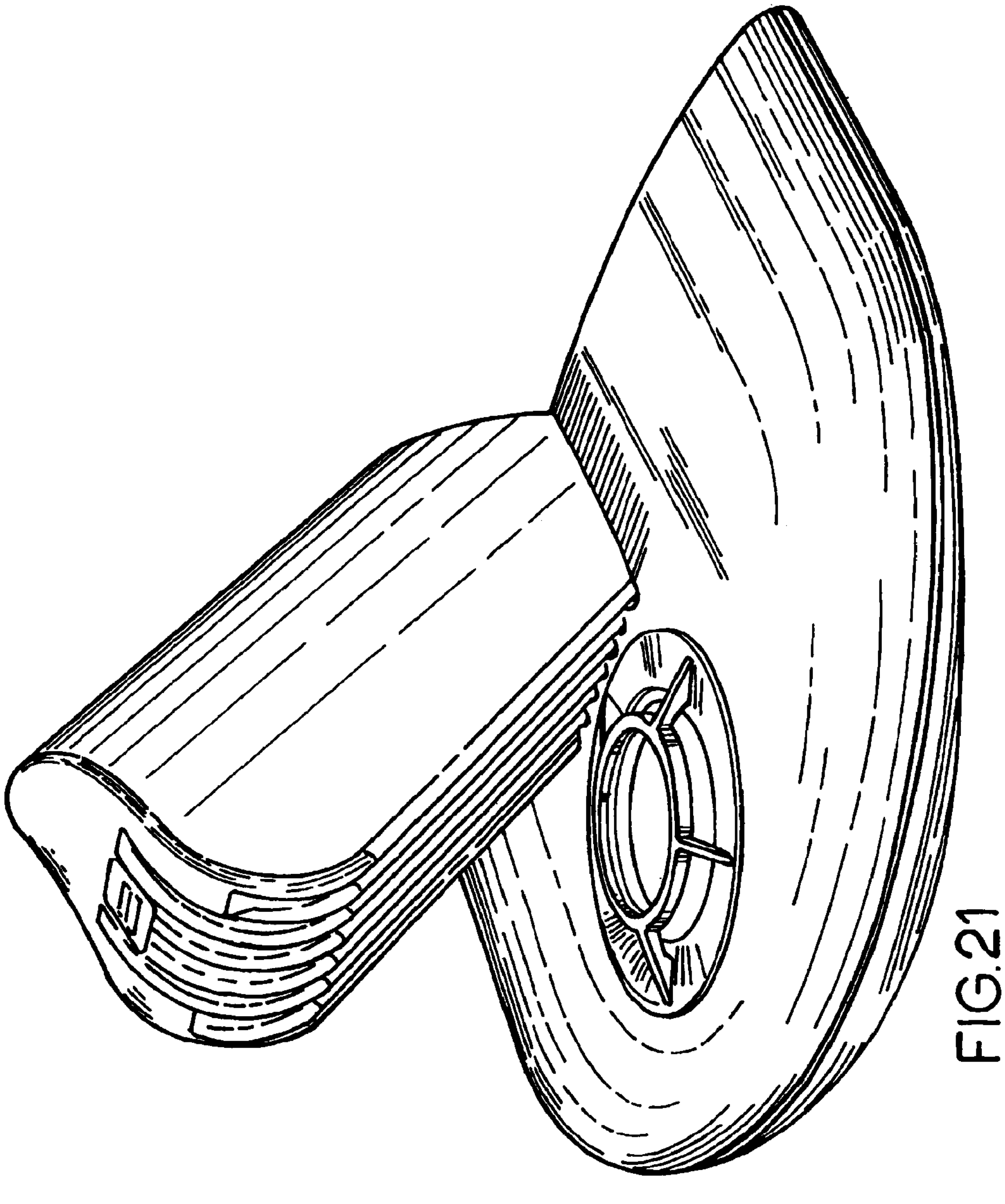
FIG. 21 illustrates a passive reflector mounted on a large base.

FIG. 21 shows a passive reflector embodiment according to this invention which has a large base that doubles as a baffle causing acoustical energy to be forced onto the reflector device and then into the listening space.

U.S. Pat. No. 5,764,782 describes matrix of speakers which may be used in the present invention. Referring to FIGS. 6A and 6B of U.S. Pat. No. 5,764,782 it is easier to design to control errors in achieving the QRS induced diffuse wave function by changing the configuration to an array of matched driving elements. FIG. 6A shows a plan view of a one-dimensional cluster 30 of 5 radiating drivers 32*a*-32*e*. FIG. 6B shows the embodiment of FIG. 6A, in cross-section. The individual set-back depths of the speaker driver units are determined by the solution to the Quadratic Residue Array with N=5. When the unit depth is equal to 75 mm, the solutions are as listed below in Table 7.

TABLE 7

| Solutions for a low frequency Quadratic Residue Sequence Driver Array | | |
|---|---|---|
| Element Number | Sn | Depth (Unit = 75 mm) |
| 0 | 0 | 0 mm |
| 1 | 1 | 75 mm |
| 2 | 4 | 300 mm |
| 3 | 4 | 300 mm |
| 4 | 1 | 75 mm |

The speaker drivers 32*b*, 32*c*, 32*d* and 32*e* of FIG. 6B (U.S. Pat. No. 5,764,782) each drive a small load due to the column of air, effectively mass loading the driver. Since speaker driver 32*a* is mounted flush with the surface, it does not experience the extra mass loading effect. Mass loading causes the loaded drivers to experience changes in both resonant frequency and in sensitivity. The change in resonant frequency causes large differences in driver electrical loading, whether the driver are wired in series or in parallel. The change in sensitivity will causes the quadratic residue sequence to falter due to amplitude variations between the sequence elements.

To compensate for the air loading, a complimentary mechanical mass may be added to each individual speaker driver such that each speaker driver 32*a*-32*e* all have the equal mass loading, either from the air column, the added mechanical mass, or a combination of the two. Thus, the driver resonant frequencies will be equal, so they can be wired either in series or in parallel, and the sensitivity of each quadratic residue sequence element will be equal.

The effective mass of the air column can be computed either by calculating it from the density and volume of air in each well, or by the shift in resonant frequency of the mass loaded drivers.

Figure 14:
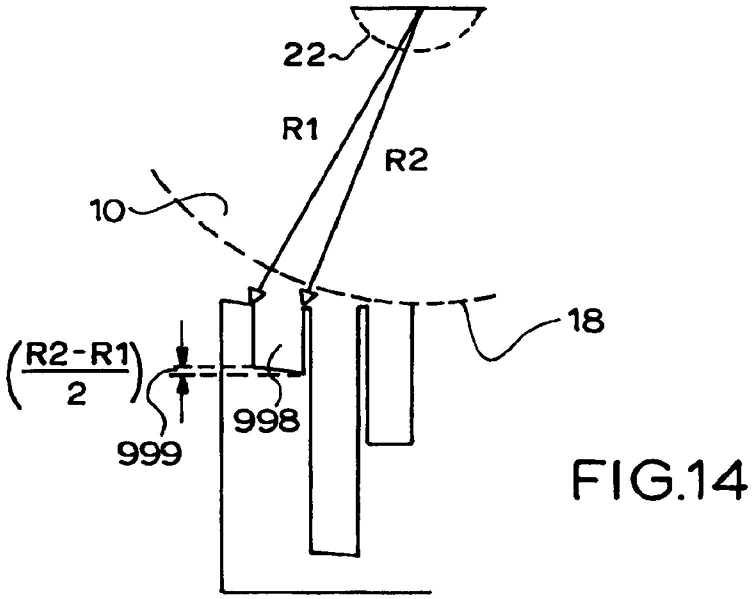
FIG. 14 is a cross-sectional view taken along section 3-3 of FIG. 1 of a reflector in accordance with the present invention having wells in the surface, the depths of the wells governed by a Quadratic Residue Sequence and the alignment and curvature of the bottom of the wells adjusted to compensate for acute arrival of energy across the mouth of the slots.

In this invention FIG. 14 of the drawings shows the reflector of FIG. 4 but modified to compensate for acute arrival of energy across the mouth of the slots. The source emits a generally spherical wave front 22 which has the generally spherical wavefront 18 arriving at the front surface of the reflector. In the case of say the furthermost recessed slot 998 the energy arriving at the inner edge of the slot has radius R1 and the energy arriving at the outer most edge of the slot has radius R2. In one embodiment the bottom of the slot is linear tapered from the outer edge to the inner with the outer edge being a distance 999 of (R2−R1)/2 higher on the outer side than on the inner side. This will cause the inner energy to travel a distance of R2−R1 further than the outer energy as it travels into the slot and is reflected back out. Thus the generally spherical energy that impinges the slot shall propagate out of the slot in a generally flat wavefront. This extra correction will compensate for acute arrival of energy across the width of a slot. The bottom of the slot in this example is linear tapered but in a preferred embodiment it is concave tapered to exactly compensate for the concave shape of the wavefront impinging on the front of the reflector. In this preferred embodiment across the width of the slot the bottom is tapered at exactly half the difference of the difference of arrival energy distance from the inner edge to the point across the slot that is being compensated.

Figure 15A:
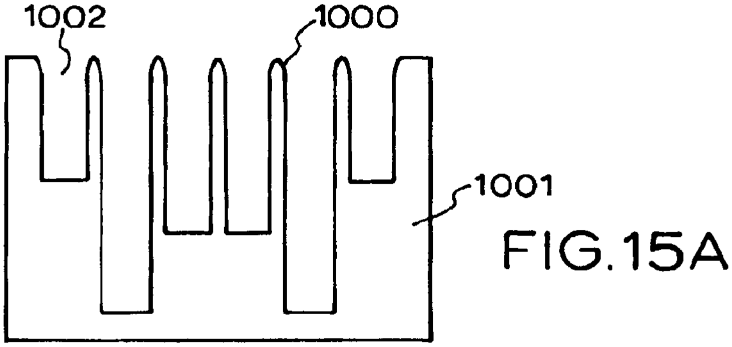
FIGS. 15 A and 15 B are cross-sectional views taken along section 3-3 of FIG. 1 of a reflector in accordance with the present invention having wells in the surface, the depths of the wells governed by a Quadratic Residue Sequence and the top of the well separator fins being acoustically fluted to minimize reflection from the front surface of the reflector.
FIG. 15B shows fluting on the external edges as well.

FIG. 15A shows the preferred embodiment of FIG. 4 consisting of a reflector section 1001 with the top of the slots fluted 1000 to minimise acoustic reflections from the mouth of the slots 1002.

Figure 15B:
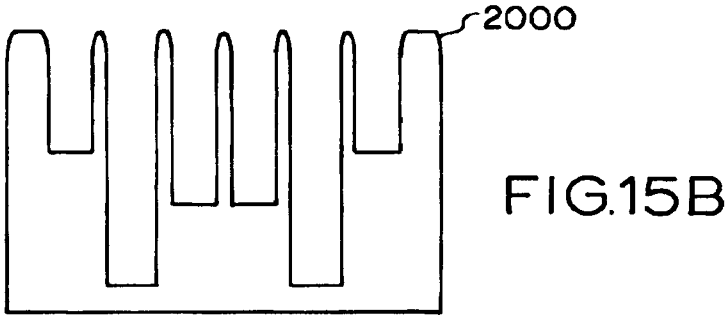

FIG. 15B shows the same embodiment of FIG. 15A but with the outside edges 2000 also fluted to minimise diffraction from these edges.

Figure 18:
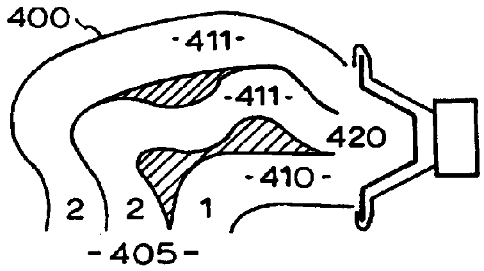
FIG. 18 is a sectional view of a manifold arrangement and FIG. 18 B shows a plan view of the front of a manifold.
Figure 18B:
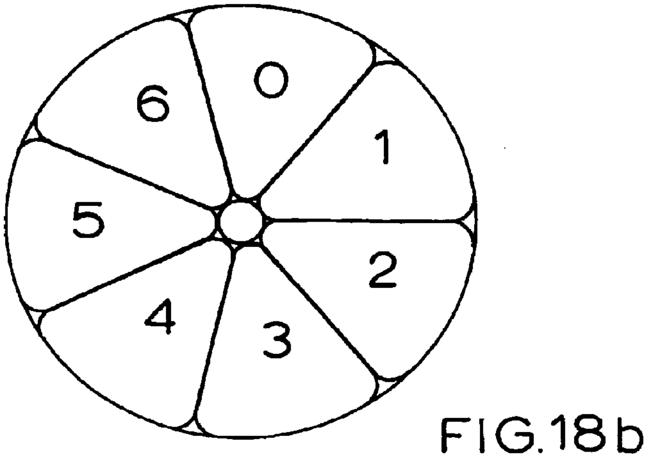

Referring to FIG. 18 there is shown a view of a manifold system 400 which is split by a splitter 420 into a number of parallel sections whereby the length of parallel sections 410 and 411 are determined by the use of the QRS and the end of the parallel sections for an array 405 which radiates into a fluid or vacuum space environment. In this embodiment the sequence starts at n=2, with an element offset of 2, for a N=3 array and continues one full cycle, N=3 elements, to finish at n='4. The resultant solutions to the QRS are 0,2,0 and the parallel section 411 is of the correct multiple of the unit depth longer than the shortest parallel sections 410. The spacing of the parallel sections are controlled by w, the diameter of the manifold and the shortest wavelength limited by inter array elements. In this way losses due to the wake contribution of the radiating or inductive manifold array 405 is minimised causing decreased back-pressure on the fluid medium within the system coupled to the manifold and or provides diffusion into the fluid or vacuum space environment into which the manifold radiates. Such manifold may be used in compression drivers and ceiling speakers, or as a general tweeter or enclosed driver arrangement.

Figure 16:
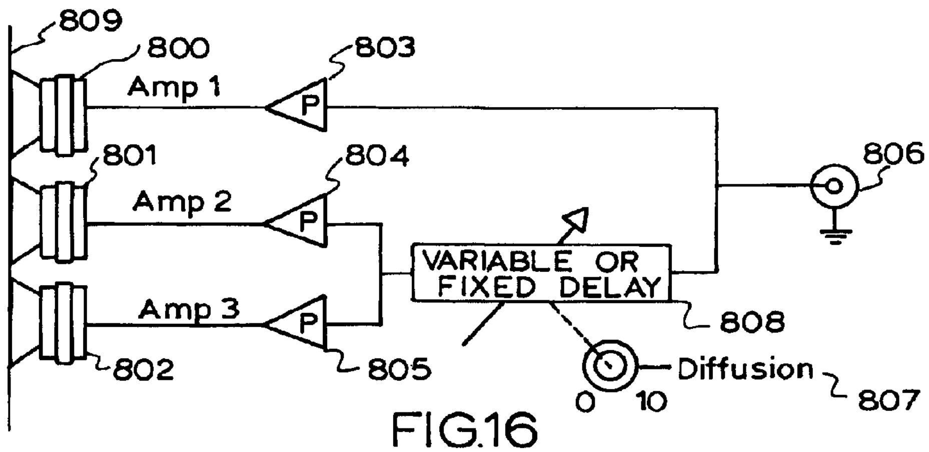
FIG. 16 is a schematic view of an electro-acoustical embodiment and FIG. 16A shows a plan view.
Figure 16A:
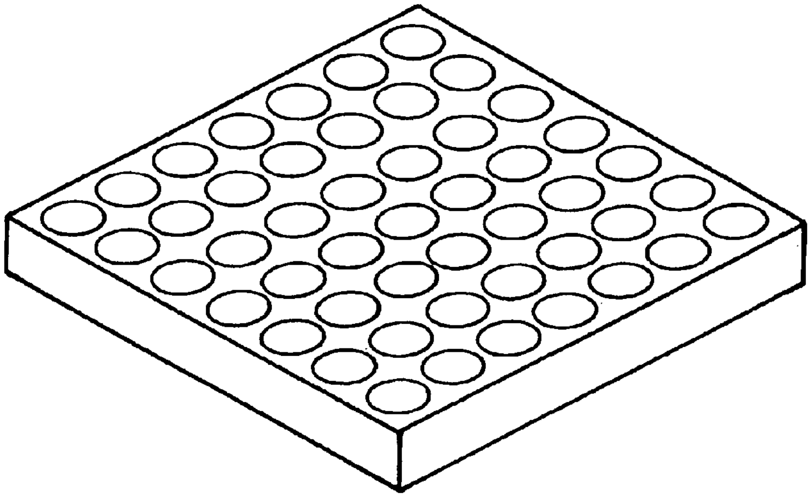

FIG. 16A shows a flat picture frame style loudspeaker array consisting of 49 individual drivers arranged in a 7×7 matrix. All drivers are mounted on the front surface.

Figure 17:
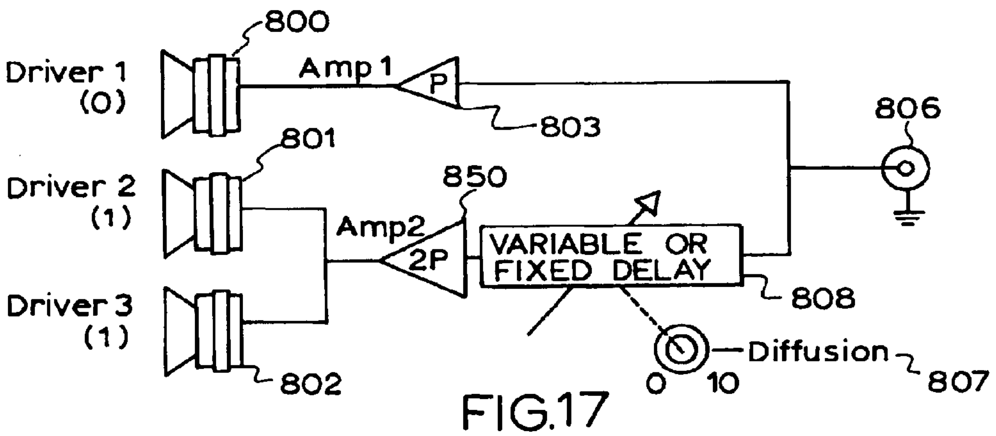
FIG. 17 is a schematic view of an alternate electro-acoustical embodiment.
Figure 19:
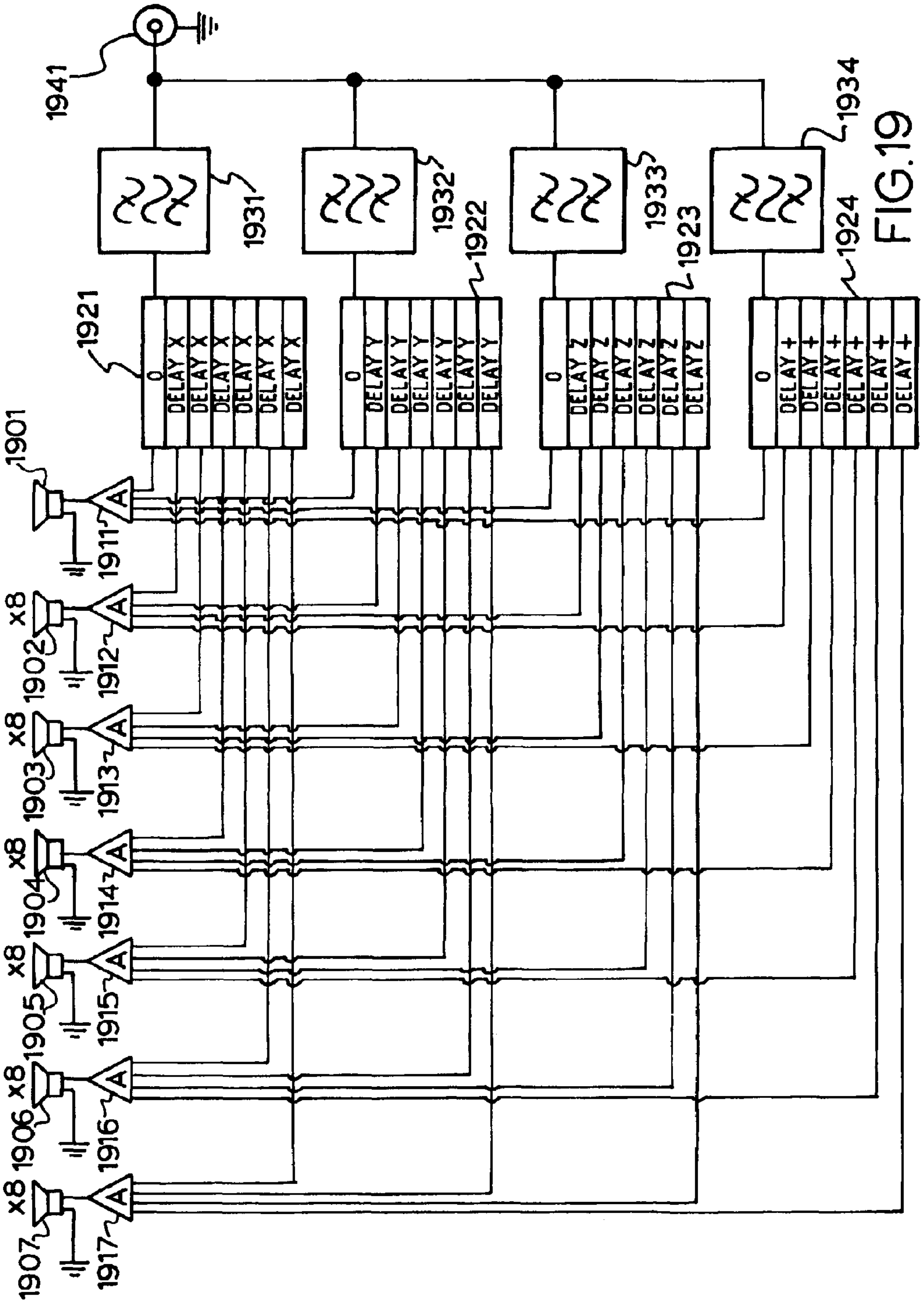
FIG. 19 is a schematic view of an electro acoustical embodiment of the invention that includes multiple scales of diffuse waves.

FIGS. 16, 17 and 19 illustrate an active system of producing the same effect as produced by the passive reflectors described above. Instead of using reflectors that produce a time delay sequence the time delay is introduced electronically.

FIG. 16 shows an alternative embodiment of a 3×1 QRS loudspeaker array. In this embodiment the drivers 800, 801, and 802 are all positioned on the same surface such as a conventional loudspeaker enclosure as known in the art. However, each driver 800, 801, and 802 are in turn driven by individual amplifiers 803, 804, and 805 each having a power P which matches that of the driver requirement. Although power matching is preferable it is not critical to this application. The input is a signal injected into this embodiment at the input 806. This feeds two signal paths. The first being the direct path into amp 803 being the amp for the 0 element of the QRS sequence. The second path is to variable or fixed delay module 808 which in turn feeds amps 804 and 805. The variable or fixed delay 808 can be driven by a diffusion control 807 which the user sets to choose the delay time. The delay time is chosen to represent the same distance as would be chosen if this were a passive array for a reflector as described above.

Furthermore, by having a variable control it is possible to limit the lower design frequency of the diffusion using the diffusion dial control 807. When the diffusion dial 807 is set to 0 sec delay the three way driver array acts like prior art. When delay is added via the diffusion dial 807 the three way array starts to act as a diffuse array with higher frequency limit set by the inter driver distance as described earlier in this patent and lower frequency limit set by the absolute delay time in the variable or fixed delay module 808 according to the relationship between the speed of sound in air, or the fluid in which this array operates, and the equivalent physical distance the delay time represents being equivalent to one unit depth d as described earlier in this patent. QRS sequence where N>3 can be used where more variable or fixed delay modules 808 are used to achieve time delays at multiple of unit depths d to achieve the equivalent units depth sequence element number to drive the particular driver. Similarly, two dimensional arrays can be used.

In FIG. 17 a preferred embodiment of that as described in FIG. 16 is shown. In this embodiment instead of using two amps 804 and 805 as shown in FIG. 16 to drive drivers 801 and 802, a single amp 850 with twice the power 2P is used to drive both drivers 801 and 802. This can be done as both drivers 801 and 802 have the same element number assignment and therefore can be driven by the same delayed signal. This embodiment saves on the number of discrete amps required. Whilst it is preferable that the power of amp 850 be twice that of amp 803 as it has twice the load, this is not critical to this application. In higher order arrays or two dimensional arrays this method can significantly reduce the number of discrete amps required. Each element of the higher order array which has the same element assignment can be driven by the one delay and amp. Amplifier power is preferably scaled to reflect the combined load of the plurality of drivers.

FIG. 19 shows a schematic for the DSP control of a 7×7 array of drivers configure in a QRD fabric. The fabric refers to the wiring of common element solution drivers in series, parallel, or a combination of the two.

Referring to FIG. 19 shows an alternative embodiment of a 7×7 QRS active loudspeaker array. Speakers 1901 (1 off), 1902 (8 off), 1903 (8 off), 1904 (8 off), 1905 (8 off), 1906 (8 off), and 1907 (8 off), are driver by summing amplifiers 1911, 1912, 1913, 1914, 1915, 1916, and 1917.

In this embodiment the digital signal processing is used to simulate 4 different scales of diffuse wave. Input signal 1941 is fed to 4 filters 1931, 1932, 1933, and 1934. Each filter is a band pass and allows only certain frequencies through.

Delay set 1921 introduces a unit time delay ‘Delay x’. This will cause a specific scale of diffuse wave relating to the x scale factor.

Delay set 1922 introduces a unit time delay ‘Delay y’. This will cause a specific scale of diffuse wave relating to the y scale factor.

Delay set 1923 introduces a unit time delay ‘Delay z’. This will cause a specific scale of diffuse wave relating to the z scale factor.

Delay set 1924 introduces a unit time delay ‘Delay t’. This will cause a specific scale of diffuse wave relating to the t scale factor.

The outputs of the dry signal from the 4 filters 1931, 1932, 1933 and 1934 are fed to summing amplifier 1911. This in turn drives speaker 1901.

The outputs of the 1st delay tap from delay sets 1921, 1922, 1923, and 1924 which are driven by filter sets 1931, 1932, 1933, and 1934 are fed to summing amplifier 1912. This in turn drives speakers 1902.

The outputs of the 2nd delay tap from delay sets 1921, 1922, 1923, and 1924 which are driven by filter sets 1931, 1932, 1933, and 1934 are fed to summing amplifier 1913. This in turn drives speakers 1903.

The outputs of the 3rd delay tap from delay sets 1921, 1922, 1923, and 1924 which are driven by filter sets 1931, 1932, 1933, and 1934 are fed to summing amplifier 1914. This in turn drives speakers 1904.

The outputs of the 4th delay tap from delay sets 1921, 1922, 1923, and 1924 which are driven by filter sets 1931,

1932, 1933, and 1934 are fed to summing amplifier 1915. This in turn drives speakers 1905.

The outputs of the 5th delay tap from delay sets 1921, 1922, 1923, and 1924 which are driven by filter sets 1931, 1932, 1933, and 1934 are fed to summing amplifier 1916. This in turn drives speakers 1906.

The outputs of the 6th delay tap from delay sets 1921, 1922, 1923, and 1924 which are driven by filter sets 1931, 1932, 1933, and 1934 are fed to summing amplifier 1917. This in turn drives speakers 1907.

The summing amplifiers 1911, 1912, 1913, 1914, 1915, 1916, and 1917 add together the unique scaled time delayed signal relevant to the 4 bands of frequencies resulting from the filter sets to produce 4 sets of scaled diffuse waves form the one input signal 1941 out of a 7×7 active array of speakers.

This embodiment emulates the applications of different scales into different critical bands (Zwicker bands) in the audible spectrum. The possible four frequency bands are shown in table 8;

TABLE 8

| Filter | Pass band | Unit Delay |
|---|---|---|
| Filter 1 | 20 Hz to 400 Hz | 1.25 milli seconds |
| Filter 2 | 400 Hz to 770 Hz | 650 micro seconds |
| Filter 3 | 770 Hz to 1270 Hz | 394 micro seconds |
| Filter 4 | 1270 Hz to 2320 Hz | 216 micro seconds |

Figure 20:
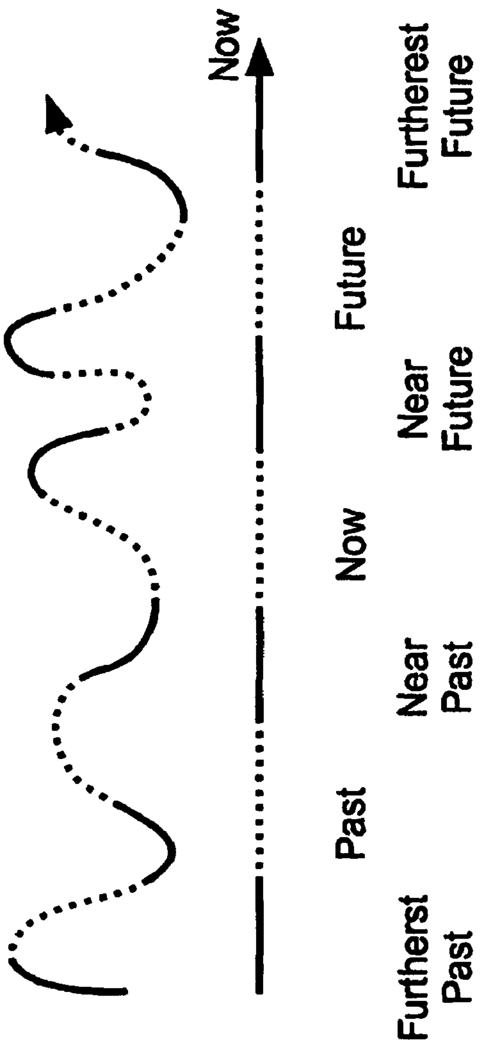
FIG. 20 is a graphical illustration of the effect produced by this invention.

FIG. 20 shows a conceptual view of a time varying signal and is tagged in series of relative times along its path. The times are nominally shown in table 7;

Table 7 shows the time varying signal of FIG. 2 in a table mapped against QRD solutions n and in turn to distances. In this table the step and repeat distance between drivers in an array would be 70 mm. The design wavelength would be 7×2×w=980 mm. This equated to a design frequency of 350 Hz. The distances are the equivalent time delays introduced by Digital Signal Processing (DSP) in a flat panel 2 dimensional array.

TABLE 9

| Historical Reference | n | Distance | ← Time |
|---|---|---|---|
| Furthest Past | 0 | −420 mm | −1224 microseconds |
| Past | 1 | −280 mm | −816 microseconds |
| Near Past | 2 | −140 mm | −408 microseconds |
| Now | 3 | 0 mm | 0 microseconds |
| Near Future | 4 | 140 mm | +408 microseconds |
| Future | 5 | 280 mm | +816 microseconds |
| Furthest Future | 6 | 420 mm | +1224 microseconds |

Table 10 is a representation of the signal time relevance at each element of a 7×7 array of speakers with a time separation pattern based on digital processing of the delays attributable to the distances shown in table 10.

TABLE 10 the historical signal mapped into the 2 dimensional diffusion 7 × 7 array.

| | | | | | | |
|---|---|---|---|---|---|---|
| Furthest Past 0 | Near Past 2 | Furthest Future 6 | Future 5 | Furthest Future 6 | Near Past 2 | Furthest Past 0 |
| Near Past 2 | Near Future 4 | Past 1 | Furthest Past 0 | Past 1 | Near Future 4 | Near Past 2 |
| Furthest Future 6 | Past 1 | Future 5 | Near Future 4 | Future 5 | Past 1 | Furthest Future 6 |

TABLE 10-continued

| the historical signal mapped into the 2 dimensional diffusion 7 × 7 array. | | | | | | |
|---|---|---|---|---|---|---|
| Future 5 | Furthest Past 0 | Near Future 4 | Now 3 | Near Future 4 | Furthest Past 0 | Future 5 |
| Furthest Future 6 | Past 1 | Future 5 | Near Future 4 | Future 5 | Past 1 | Furthest Future 6 |
| Near Past 2 | Near Future 4 | Past 1 | Furthest Past 6 | Past 1 | Near Future 4 | Near Past 2 |
| Furthest Past 0 | Near Past 2 | Furthest Future 6 | Future 5 | Furthest Future 6 | Near Past 2 | Furthest Past 0 |

In table 10 we see that at its centre is the perceived 'now' signal. This is surrounded by a ring of relative future signals and then outside of that is a ring of relative past signal etc. By manipulating the array offset and the element offset we have arranged for the 3 element to be in the centre of the array.

As it is impossible conceptually to present a future signal the human perception system rather allocates a historical perceived now signal relative to the middle of the wavelet diffuse wave produced from such as array.

One preferred embodiment uses a 70 mm wide speaker, the high frequency limit is 2,500 Hz and for N=7 the low frequency limit is 190 Hz. The unit time delay is 140 mm or 408 micro seconds.

When a 23 mm wide speaker is used, the high frequency limit is 7,500 Hz and for N=7 the low frequency limit is 580 Hz. The unit time delay is 46 mm or 134 micro seconds.

The diffusion array therefore, at any on time, has abroad dialogue of perceived now, recent past and recent future signals in the listening space. They are energizing the room in a diffusion array and therefore they are relatively uncorrelated by the method of reenergizing the room. However, given the contextual presence of perceived now, future and historical signals the listener can now build a contextual image of what the signal room acoustic is doing to the signal. This gives the listener the ability to perceive the recorded room acoustic without the listening room acoustic contaminating the experience.

The allocation of a perceived now signal is an arbitrary point behind the latest signal played (the furthest future). The transient response of the array, the wavelet, has a time=0 attribute in the middle of its response. In this way we are allocating 'now' to time=0 in this mathematical wavelet function.

Figure 24:
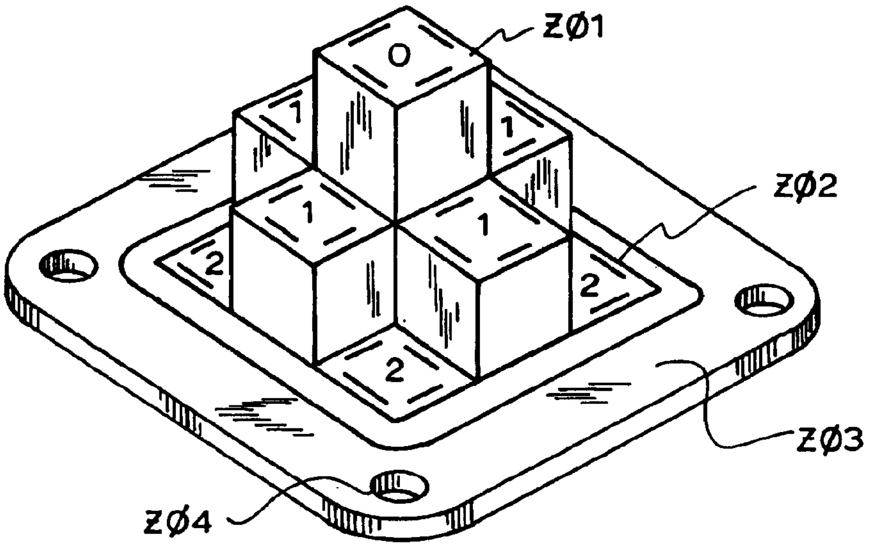
FIG. 24 and FIG. 25 show a diffuse array pattern shaped into the moving cone of loudspeaker drivers.
Figure 25:
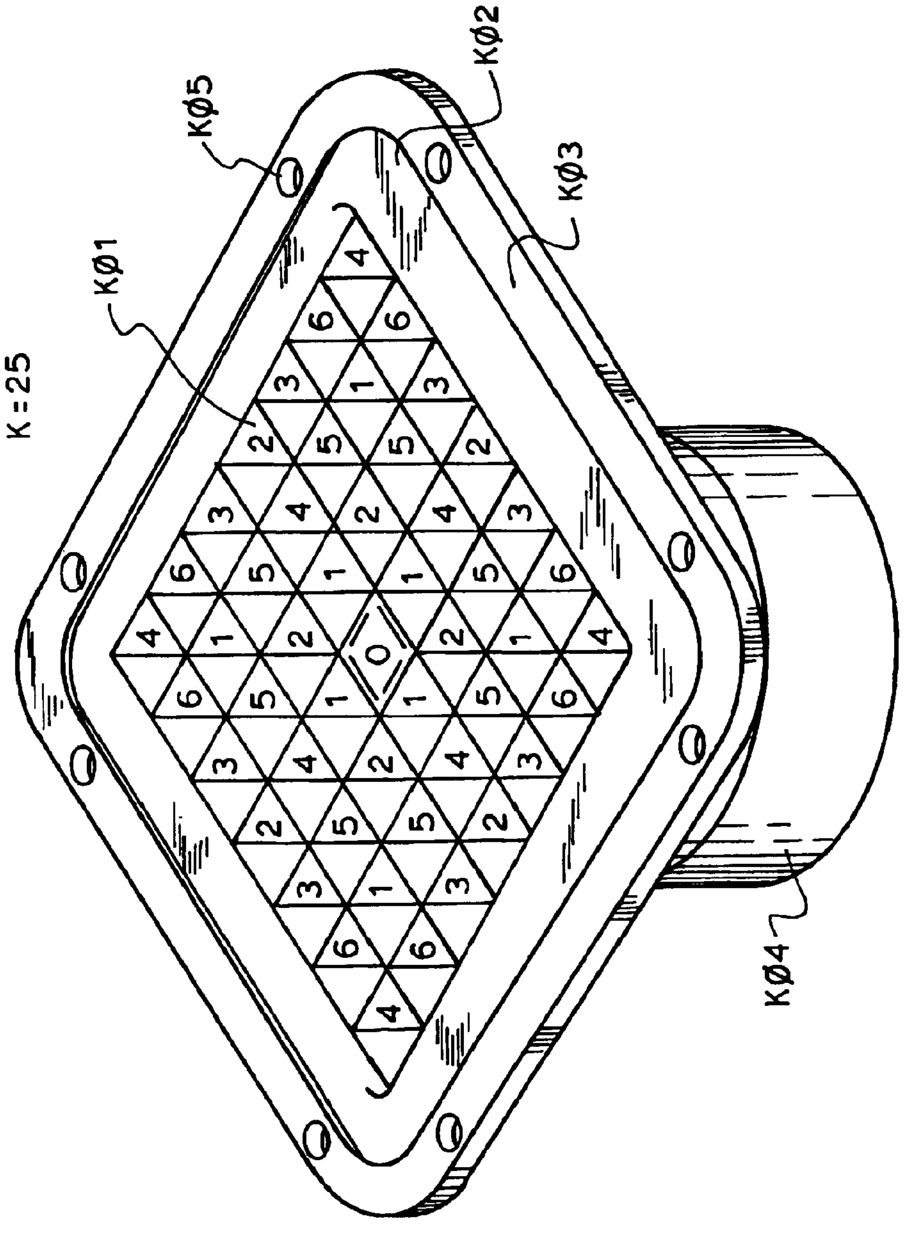

FIG. 24 and FIG. 25 show a diffuse array pattern shaped into the moving cone of loudspeaker drivers. FIG. 24 shows a 3×3 array tweeter wherein the moving cone 2401 is shaped into an array of tall spires with the centre spire having the most height. Surrounding it are 4 spires of half the height of the centre spire. These spires sit on a base that provides the surface for the remaining 4 elements. The cone 2401 is coupled to a roll surround 2402 that in-turn fixes the cone 2401 to the bezel 2403. The bezel 2403 has four mounting holes 2404 that allow this tweeter to be fixed to a loudspeaker enclosure or appliance. The tweeter incorporates a motor element that drives this cone structure in the vertical direction. The nine surfaces presented in the 3×3 array fulfill the time alignment requirements of the QRD.

FIG. 25 shows a moving cone 2501 shaped with the center element being 0 at the front surface. The adjacent element are formed as wells into a 7×7 well array. The bottoms of these wells are set to the depth as governed by the solutions to QRD. The moving cone 2501 is coupled to a roll surround 2502 that in turn is fitted to a spider structure 2503. The spider structure 2503 also supports a motor element 2504 that drive the vertical motion of the moving cone 2501. The spider structure 2503 has eight mounting holes 2505 used to mount the driver to a loudspeaker enclosure or an appliance.

The invention has been described with reference to specific embodiments. It will be apparent to those skilled in the art that various modifications may be made and other embodiments can be used without departing from the broader scope of the invention. For example, alternative forms of zero autocorrelation sequences or methods of achieving relative sequence element time delays may be used in the present invention. Therefore, these and other variations upon the specific embodiments are covered by the present invention.

What is claimed is:

1. A transducer system comprising:

a surface having a plurality of transducers arranged in an N×1 matrix or an N×N matrix, where N is an odd prime number; and wherein each transducer is driven by an amplifier and signal time delay means, and wherein each signal time delay means is governed by the relationship $T_{i,j}=[(i^2+j^2)\text{rem } N]$, where $T_{i,j}$ is a delay between signals having sequential values i, j, in a number sequence of a Quadratic Residue Sequence of the plurality of transducers.

2. A transducer system as in claim 1, wherein each transducer means is driven by the amplifier and the time delay signal means when they share the same time delay.

3. A manifold system comprising:

a surface having a plurality of manifolds arranged in an array of an N×1 matrix or N×N matrix, where N is an odd prime number; and wherein each manifold is driven by a source and signal path extension delay means, each signal path extension delay means is governed by the relationship $T_{i,j}=[(i^2+j^2)\text{rem } N]$, where $T_{i,j}$ is a delay between signals having sequential values i, j, in a number sequence of a Quadratic Residue Sequence of the plurality of manifolds.

4. A public address system, including the manifold system, as claimed in claim 3.

* * * * *